US 11,784,640 B2

(12) United States Patent
Müller et al.

(10) Patent No.: US 11,784,640 B2
(45) Date of Patent: Oct. 10, 2023

(54) HIGH-POWER SWITCHING MODULE FOR THE DIRECT PULSE ENERGY FEEDING OF A CONSUMER

(71) Applicant: Spree Hybrid & Kommunikationstechnik GmbH, Berlin (DE)

(72) Inventors: Sebastian Müller, Ahrensfelde (DE); Igor Kovalev, Berlin (DE); Karl-Heinz Segsa, Berlin (DE); Johannes Schurack, Berlin (DE)

(73) Assignee: SPREE HYBRID & KOMMUNIKATIONSTECHNIK GMBH, Berlin (DE)

( * ) Notice: Subject to any disclaimer, the term of this patent is extended or adjusted under 35 U.S.C. 154(b) by 0 days.

(21) Appl. No.: 17/806,693

(22) Filed: Jun. 13, 2022

(65) Prior Publication Data

US 2022/0399887 A1 Dec. 15, 2022

(30) Foreign Application Priority Data

Jun. 15, 2021 (DE) ...................... 10 2021 115 470.7

(51) Int. Cl.
*H03K 17/61* (2006.01)
*H03K 17/06* (2006.01)
*H03K 17/78* (2006.01)

(52) U.S. Cl.
CPC .......... *H03K 17/61* (2013.01); *H03K 17/063* (2013.01); *H03K 17/78* (2013.01)

(58) Field of Classification Search
CPC ............ H03K 17/0414; H03K 17/063; H03K 17/107; H03K 17/61; H03K 17/78; H03K 2217/003

(Continued)

(56) References Cited

U.S. PATENT DOCUMENTS 4,670,667 A 6/1987 Petit
10,637,458 B1 4/2020 Wang et al.
(Continued)

FOREIGN PATENT DOCUMENTS

DE 10 2016 223 314 A1 5/2018
WO 2007134589 A3 11/2007
(Continued)

OTHER PUBLICATIONS

European Extended Search Report, European Application No. 22165549.1, dated Oct. 17, 2022.

*Primary Examiner* — Joseph Chang
(74) *Attorney, Agent, or Firm* — Workman Nydegger

(57) ABSTRACT

Aspects of the invention relate to a high-power switching module for the direct pulse energy feeding of a consumer with a plurality of switching stages connected in series. A coupling element and an energy buffer store are provided, the coupling element coupling a primary circuit comprising a balancing capacitance and a semiconductor switch to a secondary circuit comprising the energy buffer store, the coupling element being provided and embodied for obtaining energy of the balancing capacitance and delivering this energy to the energy buffer store during the on phase of the semiconductor switch, and the energy buffer store being provided and embodied for delivering the obtained energy to an energy store of the driver assembly when the semiconductor switch is in the switched-off state.

20 Claims, 9 Drawing Sheets

(58) Field of Classification Search
USPC .......................................................... 327/124
See application file for complete search history.

(56) References Cited

U.S. PATENT DOCUMENTS

| 2010/0052648 A1* | 3/2010 | Iwabuchi | H03K 17/063 |
| | | | 323/351 |
| 2013/0241601 A1* | 9/2013 | Chen | H03K 17/063 |
| | | | 327/108 |

FOREIGN PATENT DOCUMENTS

| WO | 2011095212 A2 | 8/2011 |
| WO | 2018184607 A1 | 10/2018 |

* cited by examiner

HIGH-POWER SWITCHING MODULE FOR THE DIRECT PULSE ENERGY FEEDING OF A CONSUMER

FIELD OF THE DISCLOSURE

The disclosure relates to a high-power switching module for the direct pulse energy feeding of a consumer.

REFERENCE TO RELATED APPLICATION

This application claims priority to German Patent Application No. 10 2021 115 470.7 filed on Jun. 15, 2021, the entirety of which is incorporated by reference herein.

BACKGROUND

In many systems of laser technology, ion sources and ion optics, with high voltages it is necessary to directly switch load paths with high-power switching modules. The load of these high-power switching modules has to be brought to a low-resistance state in a very short time, in particular less than 40 ns, in order to be able rapidly and efficiently to feed in high currents or directly reverse the charge of capacitances. Examples are the gas discharge channel of a transversely electrically excited gas discharge laser, for example $CO_2$ laser, for generating light pulses having a small width, the driving of Pockels cells for light modulation and devices for controlling ion trajectories in time-of-flight spectrometers. The switching processes have to proceed very rapidly and highly precisely; repetition frequencies of up to 10 kHz or more have to be made possible.

There is therefore a need for a robust, long-lived high-power switching module which enables rapid feeding in of currents or charging and discharging of capacitances and inductances.

WO 2007/134589 A3 discloses a high-power switching module for the direct pulse energy feeding of a consumer with switching stages connected in series, each of which has a semiconductor switch with anode, cathode and control terminals and a driver network for the switching influencing of the semiconductor switch, said driver network acting on the semiconductor switch and being supplied with auxiliary energy by a pulse driver. For an individual adjustability of the temporal position of the operating point in each switching stage, the driver network has an adjustable delay element that makes it possible to set a switching stage-individual offset voltage at the semiconductor switch for the variable setting of its switch-on and switch-off points. What is disadvantageous about the solution described is that all the semiconductor switches are delayed in a targeted manner in terms of their switched-on duration depending on the respective slowest semiconductor switch. The faster semiconductor switches start to change their gate voltage from an offset.

The present invention is based on the object of making available a high-power switching module for the direct pulse energy feeding of a consumer and also a method which provide improvements with regard to the effectiveness of the high-power switching module and/or the switching synchronism of the individual switching stages.

SUMMARY

A first aspect of the invention regards a high-power switching module for the direct pulse energy feeding of a consumer with a plurality of switching stages connected in series, each switching stage having:

- a semiconductor switch (switching element) with collector terminal, emitter terminal and control terminal, which depending on the voltage present at the control terminal has a switched-on state, in which a current flows between the collector terminal and the emitter terminal, and a switched-off state, in which no current flows between the collector terminal and the emitter terminal,
- a driver assembly acting on the semiconductor switch, the driver assembly having two switches for controlling the control terminal of the semiconductor switch and also an energy store, which provides energy for switching on the semiconductor switch, and
- a balancing capacitance connected in parallel with the semiconductor switch between collector terminal and emitter terminal.

It is further provided for each switching stage to have a coupling element and an energy buffer store,

- the coupling element coupling a primary circuit comprising the balancing capacitance and the semiconductor switch to a secondary circuit comprising the energy buffer store,
- the coupling element being provided and embodied for obtaining energy of the balancing capacitance and delivering this energy to the energy buffer store during the on phase of the semiconductor switch, and
- the energy buffer store being provided and embodied for delivering the obtained energy to the energy store of the driver assembly when the semiconductor switch is in the switched-off state (i.e. is turned off).

The charged balancing capacitance is thus discharged when the semiconductor switch in the primary circuit is switched on. The secondary circuit contains the energy buffer store, which according to such aspect of the invention is additionally charged by inductive or capacitive coupling elements when the semiconductor switch is switched on. In this case, the energy buffer store obtains its energy during the on phase of the semiconductor switch and the energy store of the driver assembly obtains its energy during the off phase of the semiconductor.

Such aspect of the invention is thus based on the concept of additionally charging an energy buffer store of the respective driver assembly by energy of the balancing capacitance and thus supplying the energy of the balancing capacitance for an additional use. This is effected via the capacitive or inductive coupling element. This aspect of the invention thus provides for not allowing the energy stored in the balancing capacitance to be dissipated uselessly as heat, but rather for partly transferring it to the energy buffer store. In this way this energy can be subsequently utilized and reused for the next switching process by means of energy stores of the driver assembly. A reduction of the losses in the switching element and a reduction of the recharging losses are achieved. This is particularly advantageous at high switching frequencies since the solution shortens the time duration until the charging of the energy store in the off phase.

It generally holds true that balancing capacitances serve for optimizing the switching synchronism of the switching stages of a high-power switching module. They provide for a dynamic voltage division in the switching phase and feed the semiconductor switches to attain the definitely switched state.

In this case, charging of the energy buffer stores of the driver assemblies is effected "additionally" in the sense that the energy buffer store of the respective driver assembly is additionally charged via an ohmic balance resistance known per se. Such an ohmic balance resistance fulfils two tasks here. Firstly, it ensures statically that a total high voltage UH across the high-power switching module is divided among the individual switching stages in a balanced manner, in which case the following holds true for the voltage Un of a switching stage: Un=UH/n, where n is equal to the number of switching stages. Secondly, the voltage Un generated across a switching stage by the balance resistance brings about a balance current, part of the balance current charging the energy buffer store—independently of energy being provided by the balancing capacitance and the inductive or capacitive coupling element in the manner discussed.

In this case, the situation is in particular such that by way of the balance current an initial charge for the first switching process flows to the energy buffer store. According to aspects of the invention, when the semiconductor switch is switched on cyclically, currents and charges additionally flow to the respective energy buffer store of the driver stage. A more efficient, repetition-frequency-independent current supply of the driver assembly is ensured as a result.

The coupling element is an inductive or capacitive coupling element.

One embodiment variant of the invention accordingly provides that the coupling element comprises a transformer having a primary winding in the primary circuit and a secondary winding in the secondary circuit, the secondary circuit additionally charging the energy buffer store of the driver assembly. This embodiment variant thus provides an inductive coupling between primary circuit and secondary circuit or the balancing capacitance and the energy buffer store for the driver assembly which is realized via a transformer. The current flow between balancing capacitance and power semiconductor switch that occurs when the power stage in the primary circuit is switched on induces on the secondary side a current for charging the energy buffer store of the respective driver assembly.

Depending on the chosen winding sense of the secondary winding, for example positive or negative current supplies can be recharged. In this case, the energy buffer store is charged by the energy of the balancing capacitance during the on phase of the semiconductor switch.

In one exemplary embodiment, the transformer is embodied as a printed circuit board transformer and in this case in such a way that the primary circuit of the transformer is formed by a singular loop of a conductive plane and the secondary circuit of the transformer is formed by a secondary winding on a coil, the former being inserted into the loop. The conductive plane forming the loop can in this case be formed by a wide/flat line (for example emitter surface) that experiences a modification as a result of the loop. The conductive plane is the primary side of the printed circuit board transformer. A magnetic field forms owing to this current. The secondary side is a coil former with the secondary winding that is inserted into said loop. In this regard, both electric circuits (primary and secondary circuits) are magnetically coupled to one another.

In accordance with a further variant of the invention, the coupling between the balancing capacitance and the energy buffer store is not effected inductively, but rather capacitively. For this case it is provided that the coupling element is connected to the balancing capacitance by capacitive elements.

One embodiment variant in this respect provides that the coupling element has a coupling capacitance connected in series with the balancing capacitance, and also a coil connected in parallel with the coupling capacitance, the coupling capacitance transferring energy to the energy store of the driver assembly via a diode. In this case, the coupling capacitance is short-circuited via the coil in the off state. In the switched-on state, a further auxiliary capacitance can be connected in parallel with the first auxiliary capacitance. The coupling capacitance or such a further auxiliary capacitance feeds the energy coupled out into the energy buffer store, thereby providing the energy for the next switching process.

The energy buffer store in the secondary circuit is formed by one or more capacitive elements, for example.

A further configuration provides that an energy transfer switch is provided in the secondary circuit, said energy transfer switch ensuring that the energy buffer store in the secondary circuit delivers its energy to the energy store of the driver assembly when the semiconductor switch is turned off. Said switch is closed (i.e. allows a current flow—"on") when the semiconductor switch is turned off, and opens (i.e. blocks the current flow—"off") in the on phase of the semiconductor switch. Thus—when the energy transfer switch is open—an energy transfer from the energy buffer store into the energy store of the driver assembly is blocked in the on phase of the semiconductor switch when the energy buffer store is being charged. By contrast—when the energy transfer switch is closed—the buffer-stored energy can be transferred from the energy buffer store to the energy store of the driver assembly when the semiconductor switch is turned off.

In this case, provision can be made for the energy transfer switch to be caused to open by means of the same command or signal by which the semiconductor switch is switched on. Such a command can be provided by the same control signal that is obtained by one of the switches for controlling the control terminal of the semiconductor switch. The control signal for opening the semiconductor switch causes the opening of the energy transfer switch. By contrast, the control signal for closing the semiconductor switch causes the energy transfer switch to be changed over to the closed state, such that the energy store can be charged. In this case, the energy transfer switch is a "normally closed" switch, which is closed in the normal state. However, the control of the energy transfer switch by way of the switching commands for the semiconductor switch should be understood to be merely by way of example. Alternatively, the energy transfer switch that is closed in the normal state can be driven inductively, for example.

The secondary circuit comprises a diode. The diode defines the charging path of the energy buffer store and prevents the return flow of the energy subjected to charge reversal. For the same reason there is also a diode in the ohmic balance circuit for the initial charge.

In accordance with a further exemplary embodiment of the invention, the driver assembly furthermore comprises a thermal matching network, which influences the control voltage of the semiconductor switch in a temperature-dependent manner. The required control voltage at the control terminal of the semiconductor switch that initiates the switch-on process is dependent on the temperature, which is taken into account by the thermal matching network. For this purpose, it can be provided that the matching network is embodied for adapting the control voltage of the gate-emitter capacitance of the semiconductor switch in terms of amplitude in such a way that the switch-on point in time of the semiconductor switch is largely independent of the temperature. In this case, the thermal matching network is embodied in spatial proximity to the semiconductor switch, such that the thermal conditions present at it are the same as those present at the semiconductor switch. The thermal matching network can furthermore fulfil further functions.

The driver stage is charged stage-specifically from the energy buffer store via the matching network. Besides a compensation of temperature differences, the switch-on and switch-off behavior of each power stage is optimized by this route.

In accordance with one configuration of the invention, the energy transfer switch mentioned is arranged in the matching network. Via the switch in the matching network, after the power switch has been switched off, the respective driver stage is recharged and the driver can be triggered for the next switch-on process. In this case, the energy store of the driver assembly is connected to the output of the matching network assembly by the energy transfer switch in the off phase of the semiconductor switch. In this regard, the phase of the energy transfer from the energy buffer store via the matching network to the energy store of the driver assembly is realized in an appropriate form with respect to the load current during the off phase of the semiconductor.

It is preferably provided that the matching network and the semiconductor switch are arranged in spatial proximity and in an electrically insulated manner. The type of thermal coupling guarantees a maximum temperature difference of 0.5 K and thus a complete temperature compensation of each semiconductor switch. In this case, it can be provided that the components of the driver assembly including the matching network and also the semiconductor switch are realized on a thick-film ceramic. It can furthermore be provided that transistors and diodes of the matching network and semiconductor switches are embodied as semiconductor dies and resistances are configured by means of thick-film technology directly on a circuit carrier.

The background to the use of a thermal matching network consists in the fact that the semiconductor switches—embodied for example as IGBTs—are exposed to different temperatures in the case of operation by virtue of their positions on the circuit carrier. The effect of these different temperatures for the IGBT, for example, is that the control voltage starting from which the semiconductor switch conducts the desired current shifts upward. This effect is compensated for by the thermal matching network.

A further configuration of the invention provides that the two switches of the driver assembly for switching the semiconductor switch operate complementarily in the sense that one switch is open when the other switch is closed, and vice versa, and the two switching states define the switched-on state and the switched-off state of the semiconductor switch, the two switches being switched by the output voltage of a comparator. In this case, the two switches are in particular two transistors that are changed over to the state "on" and the state "off" with different polarities, for example n- and p-channel MOSFETs. The two switching states (respectively one switch open and one switch closed) trigger the charging phase and the discharging phase of the energy stores of the driver assembly and thus the on phase and the off phase of the semiconductor switch.

It is pointed out that the high-power switching module can be actively switched on and off by means of the two switches of the driver assembly. Both points in time, the switching on and the switching off, are implemented highly precisely with a jitter of, e.g., less than 200 ps.

In accordance with a further aspect of the invention, the high-power switching module comprises an optical trigger network, which is optically coupled to the driver assemblies of the individual switching stages in order to simultaneously switch the switching stages, the optical trigger network having a plurality of light emitting elements switchable simultaneously between a low emitted luminous flux and a high emitted luminous flux, and each light emitting element of the optical trigger network being assigned at least one light detecting element of a switching stage, the at least one light detecting element initiating a change in the switching state of the switching stage depending on whether said element receives a low luminous flux or a high luminous flux.

This configuration of the invention is based on the concept of optically transferring the trigger signal that initiates the switching phase of the semiconductor switch. All capacitive, inductive or galvanic coupling paths between the optical trigger network and the switching stages can be minimized to such an extent that they are negligible. The optically triggered drivers of the switching stages enable the power switch to be switched on and off with deviations in the ps range.

The light emitting element is for example a light emitting diode (LED) or a laser diode, for example a VCSEL diode. The light detecting element is for example a photodiode.

One embodiment variant provides that the light emitting elements are set stage-individually to a current at the operating point at which the light emitting element emits a luminous flux, a positive or negative additional current being impressed on the current at the operating point for switching over to a high luminous flux or a low luminous flux (the positive additional current amplifying the current at the operating point and initiating a high luminous flux, and the negative additional current reducing the current at the operating point and initiating a low luminous flux). The current at the operating point is preferably put in the middle of the linear range of the light emitting element. Control around the operating point is effected by means of the trigger current dl. The operating point setting is effected stage-individually, in which case a state change from "in the off state" to "in the on state", or vice versa, can take place with the same current change dl.

In this case, it can be provided that the additional current is impressed for all light emitting elements in an identical manner in each case capacitively by the discharge of a capacitor, voltage being applied to the capacitors of the respective stages by a separate voltage source, which can also be referred to as primary trigger or pulse voltage source. This allows all light emitting elements to be simultaneously changed over to a respective other emission state.

It can furthermore be provided that the optical network controls the state of the two switches for each switching stage. This can be effected for example in two different embodiment variants. In a first embodiment variant, for each switching stage the variable voltage of the associated light detecting element is fed to one input of the comparator, while a reference voltage is applied to the other input of the comparator (threshold triggering). In a second embodiment variant, for each switching stage the variable voltage of the associated light detecting element is fed to one input of the comparator via a resistance and to the other input of the comparator via an RC element, the voltage drop across the light detecting element being fed to the inputs of the comparator with differing inertia (edge triggering).

In accordance with a further aspect of the invention, the high-power switching module is embodied in such a way that the semiconductor switch is embodied in the form of a semiconductor die (i.e. unpackaged) with a planar top side and a planar underside, which embodies the emitter terminal at its planar top side and the collector terminal at its planar underside, or vice versa, the planar underside of the semiconductor die being arranged on a planar first conductive plane and being contacted via the planar first conductive plane, a planar second conductive plane extending below the planar first conductive plane, an insulation layer extending between the planar first conductive plane and the planar second conductive plane, and from the second planar conductive plane a contact connection extending to the planar top side of the semiconductor die for the contacting of the planar top side.

In accordance with this aspect of the invention, the two current-carrying conductive planes supplying the emitter terminal and the collector terminal of the semiconductor switch with current are thus arranged in direct proximity in parallel planes and in this case are separated from one another merely by a thin insulating layer. This makes it possible to arrange the outgoing and return conductors in the first and second conductive planes such that their magnetic fields compensate for one another.

This aspect of the invention is based on the concept of largely reducing the inductance in that part of the switching system which carries high current, in order to retard the switching process as little as possible and to increase the switching synchronism of the stages and to enable a precise switch-on and switch-off process. Consequently, it is possible to realize a higher number of stages of the high-power switching module for even higher voltages. In this case, a reduction of the magnetic field from the pulse current is achieved by virtue of said magnetic field being partly compensated for by the direct proximity of the forward current and the reverse current. In this case, the forward current flows in one planar conductive plane and the reverse current in the other planar conductive plane. The inductance is reduced as a result of the direct arrangement of the planar conductive planes parallel to one another—merely separated by the insulation layer. In this case, the compensations are effected along a conductor path.

In this case, it can be provided that the two surfaces of one planar conductive plane and of the other planar conductive plane are embodied one above the other with a small offset. The latter is expedient in order to realize the interconnections of the stages.

One embodiment variant in this respect provides for the distance between the first conductive plane and the second conductive plane to be less than 100 μm. By way of example, said distance is 50 μm.

The insulation layer is embodied as a thin glass layer, for example. The first conductive plane and the second conductive plane consist of silver, for example.

In accordance with a further configuration of the invention, at least the emitter terminal of the semiconductor switch is contacted by at least one flat (i.e. thin and planar) copper clip, whose width exceeds its thickness for example by at least a factor of 1.5 and whose length exceeds its thickness by at least a factor of 2.5 (which defines the property as "clip"). By way of example, the length of the copper clip is 8 mm, the width 5 mm and the thickness 3 mm. In other configurations, the aforementioned factor can be at least 2 or at least 5 for the ratio of width to thickness and at least 3 or at least 10 for the ratio of length to thickness. The control terminal of the semiconductor switch can also be contacted via flat copper clips.

This configuration of the invention is based on the concept of bond wires that are typically used being replaced by flat copper clips. One advantage of flat copper clips is that they are more robust than bond wires and dissipate heat well, which is advantageous for high switching frequencies. Furthermore, in embodiment variants, compared with a current transfer effected by bond wires, it is possible to use a reduced number of copper clips since the latter have a larger surface area for current transfer. This is associated with a reduction of the inductance, which in turn enables an increased switching speed.

One configuration in this respect provides that in the case where the semiconductor switch is embodied as an unpackaged semiconductor die, the contact connection of at least the emitter terminal of the semiconductor switch is provided by at least one copper clip extending from the second planar conductive plane to the planar top side of the semiconductor die for an emitter contacting.

In this case, in a further configuration, provision is made of two copper clips for contacting the planar top side of the semiconductor die.

It is generally pointed out that the semiconductor switch can be embodied in diverse ways. Embodiment variants provide for the semiconductor switch to be a field effect transistor (FET), for example a metal oxide semiconductor field effect transistor (MOSFET), an insulated gate bipolar transistor (IGBT) or a mos-controlled thyristor.

A further aspect of the invention relates to a high-power switching module for the direct pulse energy feeding of a consumer with a plurality of switching stages connected in series, each switching stage having:

a semiconductor switch with collector terminal, emitter terminal and control terminal, which depending on the voltage present at the control terminal has a switched-on state, in which a current flows between the collector terminal and the emitter terminal, and a switched-off state, in which no current flows between the collector terminal and the emitter terminal, a driver assembly acting on the semiconductor switch, the driver assembly having two switches for controlling the control terminal of the semiconductor switch and also an energy store, which provides energy for switching on the semiconductor switch.

In this case, in accordance with this aspect of the invention, an optical trigger network is provided in each stage and is optically coupled to the driver networks of the individual switching stages in order to simultaneously switch the switching stages, the optical trigger network having a plurality of light emitting elements switchable simultaneously between a low emitted luminous flux and a high emitted luminous flux, and each light emitting element of the optical trigger network being assigned at least one light detecting element of a switching stage, the at least one light detecting element initiating a change in the switching state of the switching stage depending on whether said element receives a low luminous flux or a high luminous flux.

This configuration of the invention is based on the concept of optically providing the trigger signal that initiates switching of the semiconductor switch. As a result, the trigger-initiating system is excluded from disturbances since it is galvanically, capacitively and inductively decoupled from high pulse currents from the load circuit.

In accordance with one configuration, it is provided that the light emitting elements and/or the light detecting elements are set stage-individually by means of assigned setting means in such a way that in the state in which the light emitting element emits a low luminous flux, the assigned light detecting element is at the threshold for detecting a high luminous flux.

One configuration provides that the optical network controls the state of the two switches for each switching stage, which switches operate complementarily in the sense that one switch is open when the other switch is closed, and vice versa, and the two switching states define the switched-on state and the switched-off state of the semiconductor switch, the two switches being switched by the output voltage of a comparator and the optical network, for each switching stage, controlling the comparator via the luminous flux detected by the light detecting element.

A further aspect of the invention relates to a high-power switching module for the direct pulse energy feeding of a consumer with a plurality of switching stages connected in series, each switching stage having:

a semiconductor switch with collector terminal, emitter terminal and control terminal, which depending on the voltage present at the control terminal has a switched-on state, in which a current flows between the collector terminal and the emitter terminal, and a switched-off state, in which no current flows between the collector terminal and the emitter terminal, a driver assembly acting on the semiconductor switch, the driver assembly having two switches for controlling the control terminal of the semiconductor switch and also an energy store, which provides energy for switching on the semiconductor switch.

In this case, in accordance with this aspect of the invention, the semiconductor switch is embodied in the form of a semiconductor die with a planar top side and a planar underside. The semiconductor die embodies the emitter terminal at its planar top side and the collector terminal at its planar underside, or vice versa. It is provided that the planar underside of the semiconductor die is arranged on a planar first conductive plane and is contacted via the planar first conductive plane. A planar second conductive plane extends below the planar first conductive plane. Both planar conductive planes are embodied as a sheetlike layer. Furthermore, an insulation layer extends between the planar first conductive plane and the planar second conductive plane. From the second planar conductive plane a contact connection extends to the planar top side of the semiconductor die for the contacting of the planar top side.

This aspect of the invention is based on the concept of reducing the magnetic field from the pulse current in the region of the semiconductor switch by virtue of said magnetic field being partly compensated for by the direct proximity of the forward current and the reverse current. In this case, the forward current flows in one planar conductive plane, and the reverse current in the other planar conductive plane. The inductance can be reduced as a result of the direct arrangement of the planar conductive planes parallel to one another—merely separated by the insulation layer. In particular, the magnetic fields around the main current flow or bus are compensated for.

One embodiment variant in this respect provides that at least the emitter terminal of the semiconductor switch is contacted by at least one flat copper clip.

BRIEF DESCRIPTION OF THE DRAWINGS

The invention will be explained in more detail on the basis of exemplary embodiments with reference to the accompanying drawings in which.

DETAILED DESCRIPTION

Figure 1:
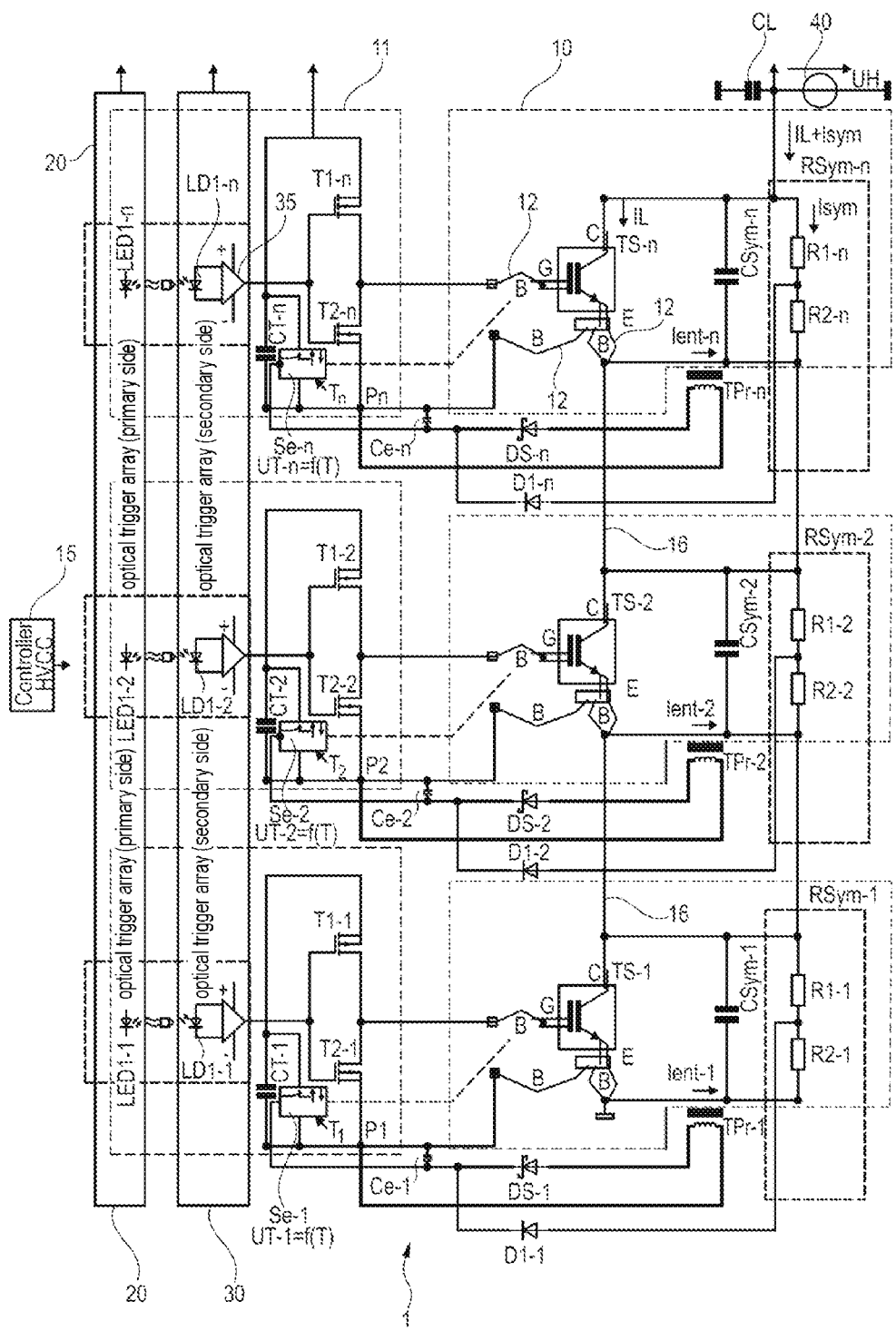
FIG. 1 shows one exemplary embodiment of a cascadable high-power switching module for the direct pulse energy feeding of a consumer, which module has a plurality of switching stages connected in series, each comprising a semiconductor switch and an energy store, in each switching stage a primary circuit comprising the semiconductor switch and a balancing capacitance connected in parallel with the semiconductor switch and a secondary circuit comprising an energy buffer store, the energy of the balancing capacitance being transferred via a coupling element to the energy buffer store of the secondary circuit and from the latter to the energy store.

FIG. 1 shows a high-power switching module 1 comprising a plurality of identically embodied switching stages 10, three of such switching stages 10 being illustrated in FIG. FIG. 1.

Each switching stage 10 has a semiconductor switch TS-n. The semiconductor switch TS-n is assigned a driver assembly 11 acting on the semiconductor switch TS-n. The driver assembly 11 comprises two switches T1-n, T2-n, which switch the control terminal G of the semiconductor switch TS-n, and also an energy store CT-n in the form of a capacitor, which provides energy for switching on the semiconductor switch TS-n. In this case, the semiconductor switch TS-n is switched on by the switch T1-n and switched off by T2-n. In this case, the energy store CT-n provides energy for the semiconductor switch TS-n if the switch T1-n is switched on. If the switch T2-n is switched on, then the semiconductor switch TS-n is rapidly switched off since the control terminal G is connected to the emitter terminal E and the control voltage rapidly decreases to 0 V.

The driver assembly 11 furthermore comprises a matching network T, which influences the control voltage of the semiconductor switch TS-n in a temperature-dependent manner, as will be explained in specific detail below. The driver assembly 11 can contain further components such as diodes and resistors, as is known per se to the person skilled in the art.

Furthermore, the switching stage 10 comprises a balancing capacitance CSym-n connected in parallel with the semiconductor switch TS-n between collector terminal C and emitter terminal E. In this case, the balancing capacitance CSym-n and the semiconductor switch TS-n are arranged in a primary circuit (also referred to as balancing circuit). The primary circuit furthermore comprises the primary winding of a transformer TPr-n, which forms an inductive coupling element. The secondary winding of the transformer TPr-n is embodied in a secondary circuit, the secondary circuit having a diode DS-n and an energy buffer store Ce-n besides the secondary winding of the transformer. The energy buffer store and the transformer TPr-n serve for delivering energy obtained from the balancing capacitance CSym-n in the secondary circuit to the energy store CT-n, during the off phase of the semiconductor switch.

The voltage supply of the high-voltage module is effected via at least one high-voltage source 40, which provides a DC voltage UH, a partial voltage Un=UH/n being present at each of n switching stages 10, said partial voltage constituting a fraction of the voltage of the high-voltage source 40. The voltage present across each switching stage 10 is in the kilovolts range, for example. The high-power switching module is provided and embodied for charging a resistive, inductive or capacitive load from the high-voltage source 40 or for discharging a capacitive or inductive source or for reversing the charge thereof.

In this regard, the high-power switching module 1 furthermore comprises a load capacitance CL. A load current IL of the high-power switching module 1 flows from the load capacitance CL when the high-power switching module 1 switches on. In this case, the load current IL flows through the complete high-power switching module 1. It is the same in all stages in this case. In order to achieve a high-current discharge with an extremely short pulse duration, it is necessary in this case for the semiconductor switches TS-n of each stage 10 to be switched exactly synchronously.

It is pointed out that in the illustration in FIG. 1 a number 1, 2, ... n indicating the respective switching stage has been added to the individual components such as the semiconductor switch TS-n, for example.

The synchronous switching of the semiconductor switches TS-n of all the switching stages 10 is triggered by a schematically illustrated optical network 20 having an optical trigger array on the emission side, an optical trigger array 30 on the reception side defining the switching state of the switches T1-n, T2-n of each switching stage 10. The optical network 20 will be explained with reference to FIGS. 6, 6a.

Figure 7:
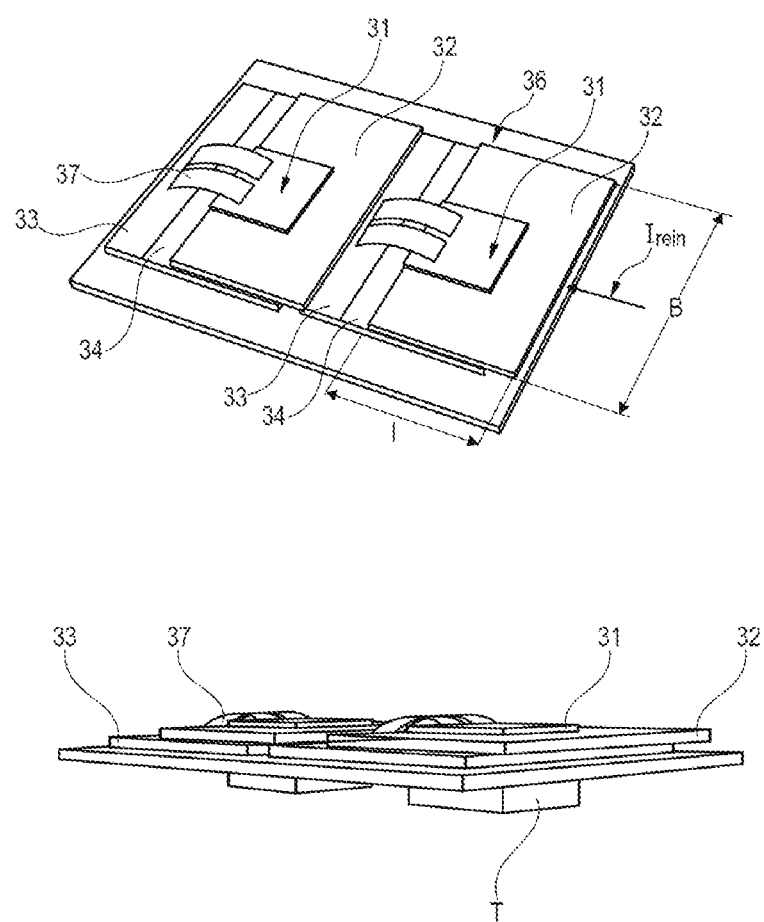
FIG. 7 shows one exemplary embodiment of the conductive planes in a switching stage in two perspective illustrations, the semiconductor switch being embodied as a bare die that is energized by two planar conductive planes arranged parallel to one another and separated from one another by an insulation layer, the emitter terminal of the semiconductor switch being contacted via flat copper clips.

Upon synchronous switching of the semiconductor switches TS-n, the load current IL flows via lines 16, which in each case directly connect collector terminal C and emitter terminal E of the semiconductor switches TS-n of two adjacent switching stages 10, through the complete high-power switching module 1. One exemplary embodiment of such lines 16 is illustrated in FIG. 7 and explained in the context thereof. In this case, the line 16 to the semiconductor switch TS-n is illustrated in a dashed manner in order to clarify that further semiconductor switches or switching stages 10 can be realized between TS-2 and TS-n.

Each switching stage 10 furthermore comprises a balancing capacitance Rsym-n, which will be explained with reference to FIG. 2.

Figure 2:
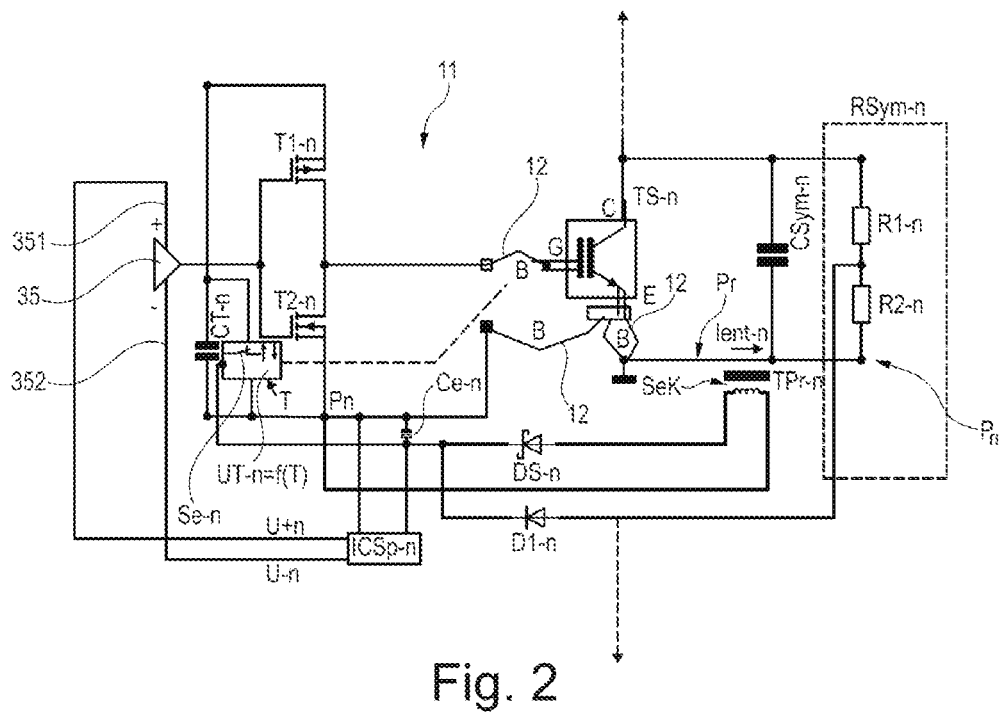
FIG. 2 shows one of the switching stages of the high-power module from FIG. 1, the coupling element being a transformer that transfers energy from the primary circuit to the energy buffer store.

FIG. 2 shows the construction of a switching stage 10 of the high-power module 1 in an enlarged illustration. In this case, it holds true that all switching stages are constructed identically.

The semiconductor switch TS-n has a collector terminal C, an emitter terminal E and a control terminal G, the control terminal G, depending on the voltage present at the control terminal G, having a switched-on state, in which a current flows between the collector terminal C and the emitter terminal E, and a switched-off state, in which no current flows between the collector terminal C and the emitter terminal E. The balancing capacitance CSym-n is connected in parallel with the semiconductor switch TS-n between the collector terminal C and the emitter terminal E.

It is pointed out that the contacting of the control terminal G and of the emitter terminal E of the transistor E is effected via schematically illustrated bond wires or alternatively via copper clips 12, as will be explained by way of example with reference to FIG. 7.

The transformer TPr-n has a primary winding pr in the primary circuit and a secondary winding sek in the secondary circuit. The energy stored in the balancing capacitance CSym-n is transferred via the transformer TPr-n into the energy buffer store Ce-n. From the latter, in the off phase of the semiconductor switch, the energy is transferred into the energy store CT-n of the driver assembly 11 via an energy transfer switch Se-n. The stage-internal discharge current Ient-n of the balancing capacitance Csym-n in each stage 10 flows through the transformer TPr-n on the primary side. The energy coupled out from the secondary circuit is fed to the energy buffer store Ce-n of the driver assembly 11 and buffer-stored there. In this case, the voltage Ue-n provided by the secondary winding of the printed circuit board transformer TPr-n is provided as energy to the energy buffer store Ce-n.

Depending on the chosen winding sense of the secondary winding, positive or negative current supplies can be recharged. In this case, it is generally provided that the energy is already passed on to the energy buffer store Ce-n in the on phase of the semiconductor switch TS-n (when current flows in the primary circuit). If the semiconductor switch TS-n is turned off, then the energy transfer switch Se-n, in the same phase, connects the energy buffer store Ce-n to the energy store CT-n of the driver assembly.

The two switches T1-n, T2-n embodied as transistors and switched on and off with different polarities are triggered complementarily by the optical network 20. In this case, the optical trigger array 30 on the reception side comprises the comparator 35, the output voltage of which switches the two switches T1-n, T2-n.

The semiconductor switch TS-n is for example a FET, a MOSFET or an IGBT.

The switching stage furthermore comprises a so-called balance current path. The balance current charges the energy buffer store Ce-n. In this case, since the energy transfer switch Se-n is always closed in the off phase of the semiconductor switch TS-n, the energy stores CT-n of the individual driver assemblies 11 are charged simultaneously. The balance current is responsible for a static voltage division at the switching stages 10. The current provided by the energy buffer store or transformer TPr-n is provided in addition to said balance current at the energy store CT-n.

The balance current path is provided by a balance resistance Rsym-n formed from two resistances R1-n and R2-n connected in series, Rsym-n being arranged in parallel with the load path through the semiconductor switch TS-n. In this case, a small balance current also flows in the off state of the semiconductor switches TS-n. In this case, provision is made for the resistance R1-n to be embodied with a higher value than the resistance R2-n, such that the majority of the stage voltage Un (for example 90%) is dropped across R1-n. A small positive amount is dropped across R2-n.

Figure 5:
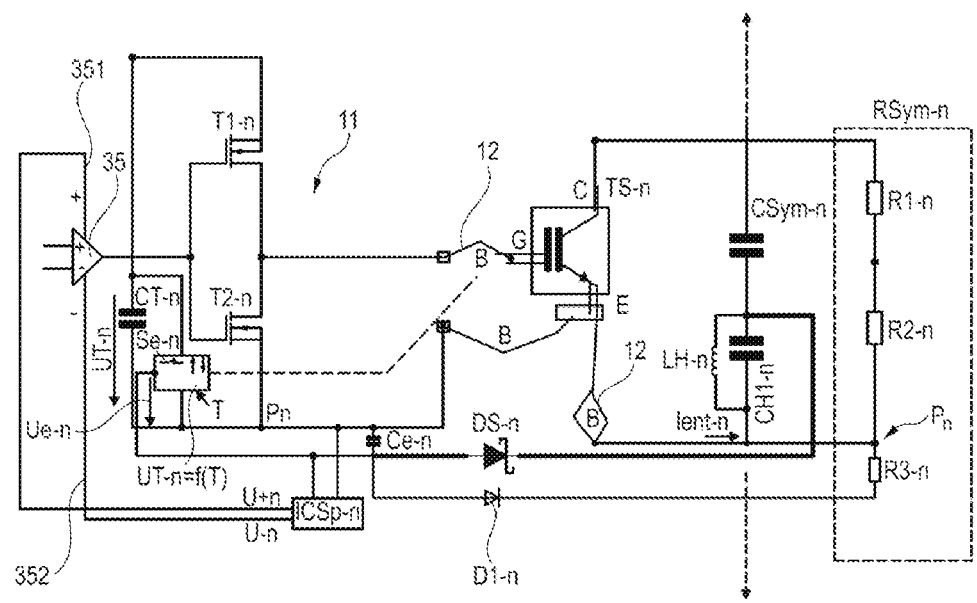
FIG. 5 shows a further modification of a switching stage of a high-power module according to FIG. 1, the coupling element being a capacitor that transfers energy from the primary circuit to the energy buffer store of the driver assembly and negatively charges said energy buffer store.

If a negative voltage contribution has to be generated by an initial charge, then a further resistance R3-n is provided, across which a small negative amount is dropped. This special case is illustrated in FIG. 5.

The ratios of the resistances R1-n and R2-n and optionally R3-n to one another determine the voltages. In this case, the reference potential Pn is present downstream of the resistance R2-n—or between the two resistances R2-n and R3-n in the case of the configuration of FIG. 5. Said reference potential Pn is present across the primary winding pr of the transformer TPr-n and the bond wires or copper clips 12 and also at the energy store CT-n and ensures the energy supply thereof via the balance current path by virtue of the fact that an electric circuit for the initial charge is closed during the off phase of the semiconductor switch or via a closed energy transfer switch Se-n and the diode D1-n.

In this case, the reference point for each voltage of a stage is always the reference potential Pn. If a voltage is higher than Pn, then it is regarded as a positive voltage. If a voltage is lower than Pn, then it is regarded as a negative voltage.

FIG. 2 furthermore shows a comparator 35, at which a positive voltage + and a negative voltage—are present on supply lines 351, 352. The output voltage of the comparator 35 controls the gate terminals of the complementarily constructed transistors or switches T1-n, T2-n. The supply lines 351, 352 are produced by a dual flyback converter ICSp-n, the input of which is supplied by a part of the balance current that is provided via the balance resistance Rsym-n. The dual flyback converter ICSP-n is a circuit that generates from an input voltage (here: a positive voltage) two polarized voltages at its output, which constitute the voltages on the supply lines 351, 352.

In order to afford a better understanding of the significance of the transformer TPr-n, firstly the state in which the transformer TPr-n is not present or is replaced by a short circuit will be considered mentally. In such a case, the energy store CT-n of the driver assembly 11 is recharged only by the balance current mentioned. In the case of such a circuit, an increase in the switching frequency of the switching stage can only be achieved by increasing the balance current, but this demands a reduction of resistance in the driver recharging current and is associated with the production of additional heat. As the switching frequency increases, an increase in the balance current results in a state in which the driver requires exactly as much energy as, for example, the capacitive payload CL connected in parallel with the high-voltage switching module 1. Alternatively, an inductive payload can be connected in series with the high-voltage switching module 1. The energy recovery via the transformer TPr-n enables the switching frequencies of the switching stages to be increased in an effective manner, without the balance current having to be increased by a reduction of resistance in the driver recharging current.

Consequently, the energy from the balancing capacitance CSym-n is not completely converted into heat during the switch-on process, but rather a part of the energy is converted into useful energy for the energy store CT-n of the driver assemblies 11. Since the heat emitted by the balancing capacitance CSym-n without subsequent utilization of energy would typically be absorbed by the semiconductor switch TS-n, the losses caused by heat at the semiconductor switch TS-n are also reduced as a result.

Both effects increase the efficiency of each switching stage 10 and thus of the high-power switching module 1 overall and enable a higher switching frequency. Of course, the high-power switching module 1 can also be operated at lower switching frequencies. A main advantage then resides in a reduction of the heat; what is applicable as a rule is that a reduction of the temperature by 10 K doubles the lifetime of the electronics.

It is pointed out once again that the subsequently utilized energy originates from the balancing capacitance Csym-n. This capacitance causes the current lent-n in each stage. This current is added in addition to the load current IL per stage. In this case, the balancing capacitance Csym-n is necessary for the dynamic voltage division.

The balance resistance Rsym-n constitutes a current source for the energy store CT-n, which current source inter alia brings the initial charge to the energy store CT-n in each stage. Before the first switching process, the energy store CT-n must be charged to the necessary initial voltage before the subsequent utilization of energy takes place. The resistance Rsym-n ensures in each stage that the partial voltage Un per stage is set to an n-th proportion of the value of the high voltage UH. The following holds true: Un=UH/n. During the first switching process, CT-n delivers the initial charge to the gate of the semiconductor switch TS-n, which initial charge was built up by way of the balance resistance Rsym-n. The semiconductor switch TS-n then carries the current lent-n that flows through the primary side pr of the transformer TPr-n. A secondary current generated thereby on the secondary side sek additionally charges the energy buffer store Ce-n of the driver assembly. For all subsequent switching processes, the current via the balance resistance Rsym-n is then of subsidiary importance since the energy buffer store Ce-n is charged via the subsequently utilized energy from the balancing capacitance Csym-n. Moreover, this buffer-stored energy is passed on to the energy store of the driver assembly CT-n via the closed energy transfer switch Se-n in the off phase of the semiconductor switch TS-n.

Figure 3:
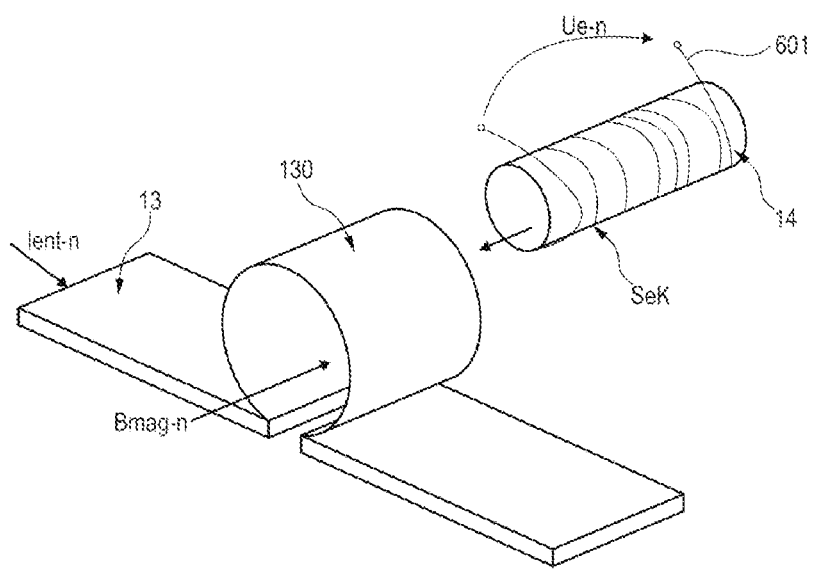
FIG. 3 shows one exemplary embodiment of the transformer in accordance with FIG. 2, the transformer being formed as a printed circuit board transformer with a wide line on the primary side, which forms a loop, and a coil former provided with a secondary winding and inserted into the loop.

FIG. 3 shows by way of example one exemplary embodiment of a transformer TPr-n in accordance with FIG. 2, which is embodied as a printed circuit board transformer. The current lent-n, when current flows in the primary circuit, flows through a wide and flat line 13, for example an emitter surface, which has a modification in the form of a loop 130. In this case, the line 13 with the loop 130 forms the primary winding of the printed circuit board transformer TPr-n. A magnetic field Bmag-n forms owing to the current lent-n.

In the exemplary embodiment under consideration, the secondary winding of the printed circuit board transformer TPr-n is formed by a secondary winding sek applied to a coil former 14, which is embodied cylindrically and provided for being inserted into the loop 130. In this regard, both electric circuits (primary and secondary electric circuits) are magnetically coupled to one another. Since the magnetic field Bmag-n permeates the secondary winding sek, when the coil former 14 is inserted into the loop 130, a positive voltage or a negative voltage Ue-n is induced in the turns of said coil former depending on the winding sense, as illustrated schematically in FIG. 3. In this case, embodiment variants can provide for a high-power switching module 1 to be realized with semiconductor switches TS-n which are switched on by a negative voltage at the control electrode G or are kept in the off state by a negative voltage and are turned on by voltage above 0 V. The arrow is drawn from positive to negative (=arrowhead).

In this case, the voltage Ue-n is provided to the energy buffer store Ce-n of the driver assembly, specifically via the matching network T and, in the off state of the semiconductor switch TS-n, via the energy transfer switch Se-n to the energy store of the driver assembly CT-n, as will also be explained with reference to FIG. 11. The situation here is such that the current Ient-n in the primary circuit in accordance with FIG. 2 causes a pulse current in the secondary circuit that results in the voltage Ue-n.

Referring once again to FIGS. 1 and 2, the voltage Ue-n is applied to the energy buffer store in the form of the capacitance Ce-n. Then, as mentioned, the voltage present across the capacitance Ce-n is then also matched in terms of amplitude by the thermally coupled matching network T and fed to the energy store CT-n of the driver assembly under consideration via the closed energy transfer switch Se-n in the off phase of the semiconductor switch TS-n.

Figure 9:
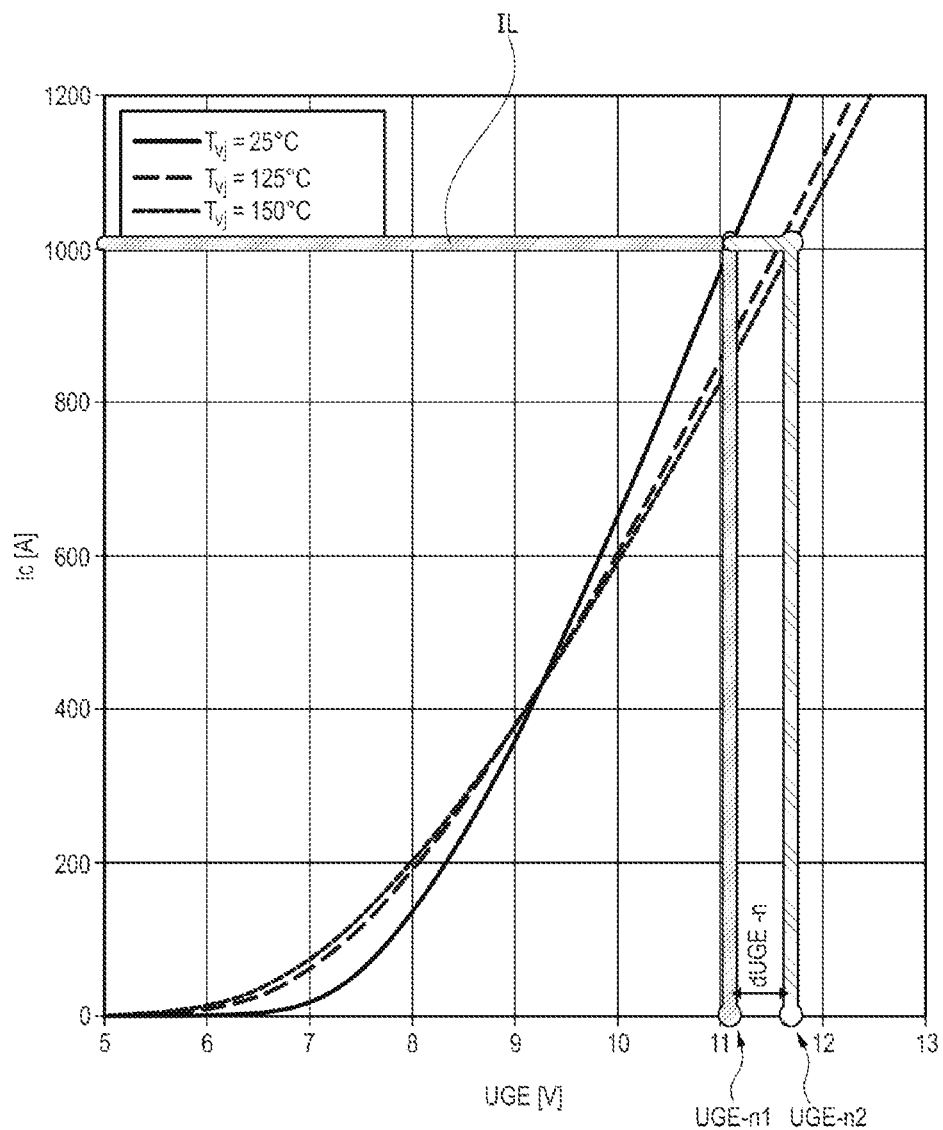
FIG. 9 shows the transfer characteristic of a semiconductor switch embodied as an IGBT as a function of temperature on the semiconductor.

The following should be noted with regard to the matching network T. The switching elements TS-n of the individual switching stages are exposed to different temperatures in the case of operation by virtue of their positions on a circuit carrier. The different temperatures result in the effect that the control voltage of the semiconductor switch TS-n shifts. This is illustrated schematically in FIG. 9, which illustrates the typical transfer characteristic of an IGBT as an example of the semiconductor switch. In order to be able to attain the same current IL through the semiconductor switch of 1000 A, a control voltage UGE at the gate-emitter capacitance of 11 V is necessary at 25° C., while the control voltage UGE must be 11.7 V at a temperature of 150° C. The voltage difference in this regard is designated as dUGE-n, the voltage difference dUGE-n being the difference between two control voltages UGE-n1 and UGE-n2 at switching elements of two different switching stages n1, n2. The voltage UGE-n is stage-individual.

It is pointed out that the voltage UGE at the gate-emitter capacitance cannot jump. It will always build up according to a time constant until the input value is established. In order to satisfy the requirement from FIG. 9, the voltage Ue-n provided by the printed circuit board transformer TPr-n is matched to UT-n in the matching network T, such that stage-individually (in a manner matched to the present temperature) with UT-n the necessary gate-emitter voltage UGE-n is provided at the control terminal G of the semiconductor switch TS-n.

Figure 10:
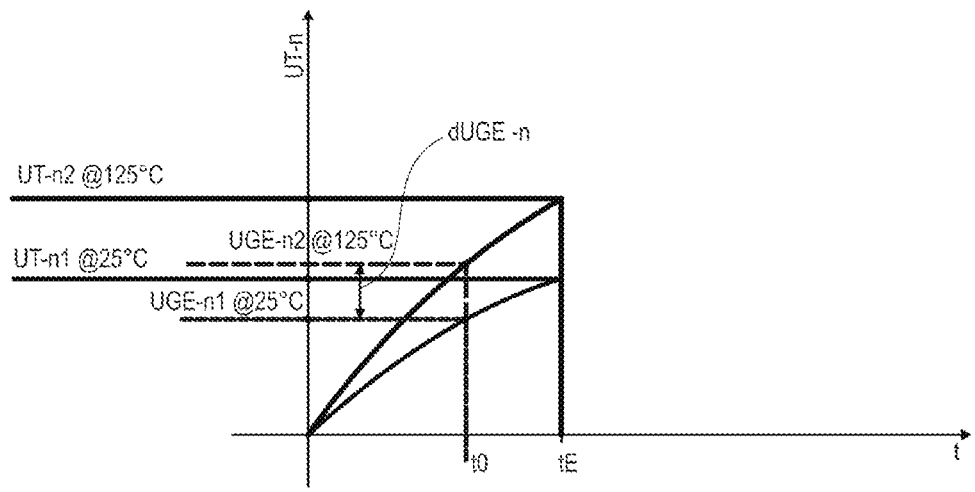
FIG. 10 schematically shows the thermal matching of the voltage at the control terminal of the semiconductor switch by a matching network that is thermally coupled to the switching elements of the associated stages.

This is illustrated by FIG. 10, which illustrates the switched-on duration t of the semiconductor switch TS-n as a function of the voltage UT-n for two switching stages with voltages UGE-n1, UGE-n2, UT-n1 and UT-n2. In this case, t0 indicates the point in time at which the semiconductor switch starts to turn on. tE indicates the point in time when the peak current IL through the semiconductor switch is reached. The current profile can also be referred to as a pulse current that is characterized by a steep rise and the peak current.

The necessary voltage difference for UGE-n2 at higher temperatures for the same current is compensated for by increased voltage UT-n2 insofar as it is present at the same speed t0. The high precision of the switching is ensured as a result: UGE-n2 @ 125° tends toward attaining a higher end value UT-n2 @ 125° C. than UGE-n1 @ 25° C. in relation to UT-n1 @ 25° C. The matching network T thus matches the input value UT-n on the energy store CT-n with the temperature, such that the necessary UGE-n value after the trigger signal is established in a time t0 of equal length. This guarantees that the current rise starts at the same point in time t0 and the peak current IL (e.g. 1 kA) is also definitely attained at the point in time tE.

Figure 11:
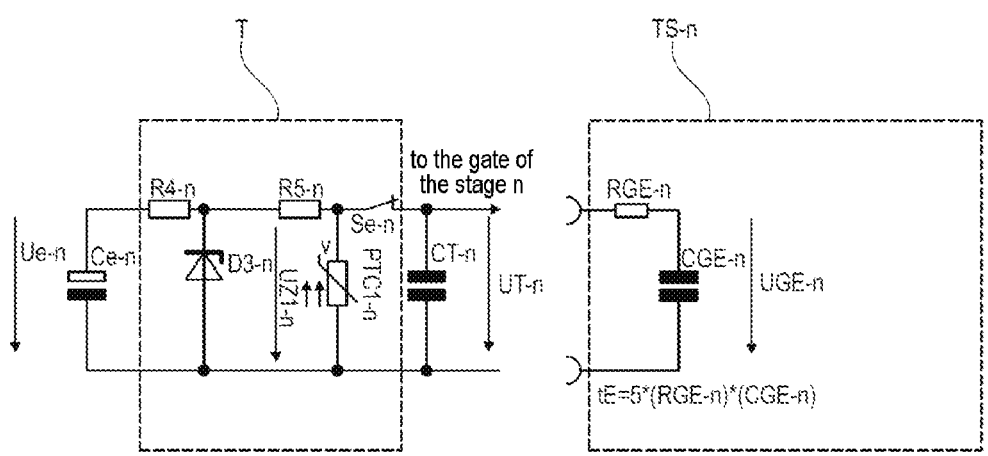
FIG. 11 shows one exemplary embodiment of a matching network such as is usable in the high-power module in accordance with FIG. 1 in the individual switching stages, the matching network influencing the control voltage of the semiconductor switch of the respective switching stage in a temperature-dependent manner.

FIG. 11 shows one exemplary embodiment of such a matching network T. In this case, a gate equivalent circuit diagram of the semiconductor switch TS-n, said diagram comprising a capacitor CGE-n and a resistance RGE-n, is illustrated on the right-hand side of FIG. 11. In this case, RGE-n can be a physical component or just represent the construction resistance. The voltage UGE-n is present at the capacitor CGE-n.

The left-hand side of FIG. 11 shows the actual matching network T, which changes the voltage Ue-n (provided by the secondary winding sek of the transformer TPr-n) to a voltage UT-n and matches Ue-n in this respect. In this case, the voltage Ue-n is present at the matching network T via the energy buffer store Ce-n.

The matching network T comprises a Zener diode D3-n, a temperature-dependent resistor PTC1-n, the energy store CT-n and two resistors R4-n, R5-n. The voltage UT-n for the gate of the semiconductor switch TS-n is provided at the output of the matching network. The energy transfer switch Se-n connects the assembly to the energy store of the driver assembly CT-n while the semiconductor switch TS-n is turned off. The Zener diode D3-n is reverse-biased and serves as a stabilization element.

The functioning of the circuit is such that the resistance of the temperature-dependent resistor PTC-1 rises with the temperature, such that the voltage drop across PTC-1 increases and less and less current flows through PTC-1 as the temperature increases. Thus, as the temperature increases, also less and less current flows through the resistor R5-n, such that less and less voltage is dropped across R5-n. The voltage UT-n is equal to the voltage Ue-n minus the voltages dropped across the resistors R5-n and R4-n. With a lower voltage drop across R5-n as the temperature increases, the voltage across UT-n thus rises as the temperature increases.

Alternatively, instead of the PTC1-n it is possible to use a temperature-dependent resistor with a negative temperature coefficient, for which case the resistance decreases with the temperature and more and more current flows through R5-n as the temperature decreases. The voltage to which the energy store CT-n is charged then decreases as the temperature rises.

In summary, the voltage at the control terminal G of the semiconductor switch TS-n is tracked by the matching network T, such that even in the case of different temperatures of the semiconductor switches TS-n of different stages 10 these are switched on exactly at the same point in time and provide the same current.

In this case, provision is made for the matching network T to be exposed virtually to the same temperature as the semiconductor switch TS-n. That is done by means of the circuitry elements of the matching network being in spatial proximity to the semiconductor switch TS-n. The circuitry elements (resistors, transistors and diodes) are preferably realized on a thick-film ceramic (owing to good thermal conductivity and electrical insulation at the same time). These transistors and diodes are embodied as dies and the resistors as a result of the thick-film technology are con-FIG.d directly on the circuit carrier. The thermal contact resistances are thus also reduced to a minimum, such that the effect achieved is maximal.

Figure 4:
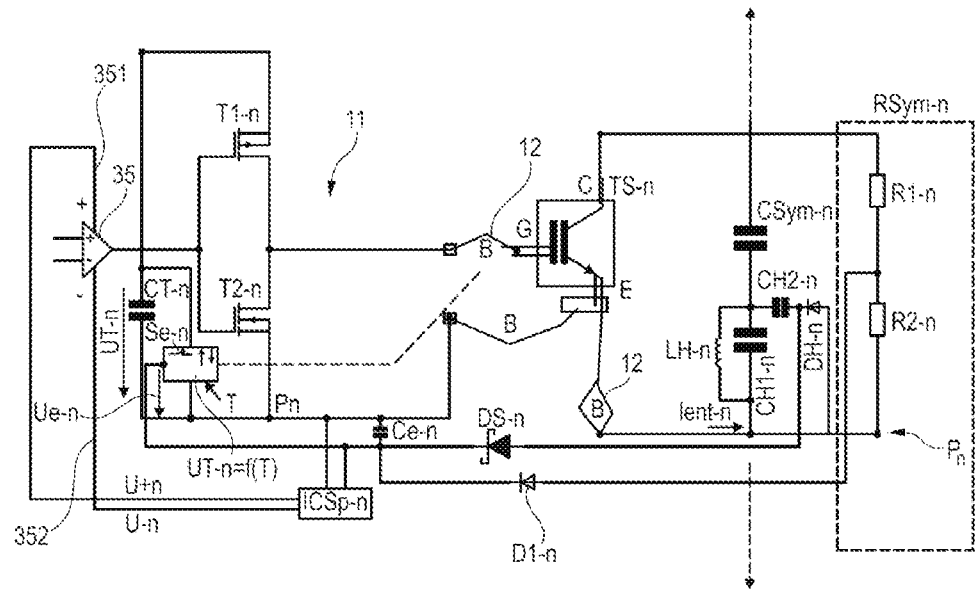
FIG. 4 shows one of the switching stages of a high-power module according to FIG. 1 in a modification to the effect that the coupling element is a capacitor that transfers energy from the primary circuit to the energy buffer store of the driver assembly and positively charges said energy buffer store.

FIG. 4 shows a switching stage 10 in which the energy stored in the balancing capacitance is transferred to the energy buffer store Ce-n by way of a capacitive coupling. Otherwise there are no differences with respect to the switching stage 10 in FIG. 2, and so reference is supplementarily made to the explanations concerning FIG. 2. In particular, a matching network T is once again provided.

In comparison with FIG. 2 there exist per stage in each case two auxiliary capacitances CH1-n, CH2-n, one auxiliary inductance LH-n and one auxiliary diode DH-n. The capacitances are in a ratio CH1-n:CSym-n of, for example, 1:10 (the ratio is less than 1 in any case) and CH1-n=CH2-n. In the discharge phase of the balancing capacitance CSym-n (during the on phase of the semiconductor switch TS-n) the auxiliary capacitance CH1-n is in each case charged by the current Ient-n negatively in relation to Pn to 1/10 of the stage voltage. The capacitance CH2-n is charged positively and this charge is transported via the Schottky diode DS-n into the energy buffer store Ce-n of the driver assembly 11 and buffer-stored there. During the off phase of the switching element TS-n, via the closed energy transfer switch Se-n the energy is transferred from the energy buffer store Ce-n into the energy store of the driver assembly CT-n.

In this case, the capacitance CH2-n is in parallel with the capacitance CH1-n in the on phase of the semiconductor switch TS-n. Via the diode DS-n the positive pole of CH2-n is connected to the matching network T, which from the voltage fed in generates the voltage UT-n for the energy store CT-n appropriately with respect to the temperature. CT-n is charged to this voltage UT-n when Se-n is closed while the switching element TS-n is turned off. In this regard, the charge can additionally flow from CSym-n to CT-n. In this case, the auxiliary capacitance CH2-n constitutes a capacitive coupling element, from which the positive voltage Ue-n is generated. This voltage—after being buffer-stored in the energy buffer store Ce-n—is converted into the positive voltage UT-n by the matching network T.

In specific detail: during the off phase CH1-n is short-circuited via LH-n. If the semiconductor switch TS-n is switched on, then the capacitance CH2-n is connected in parallel with the capacitance CH1-n via the diode DH-n. A voltage is induced at the inductance LH-n. All three elements CH1-n, CH2-n and LH-n are charged to this voltage. The diode DH-n prevents the capacitance CH2-n from being discharged directly toward the emitter. However, the depicted path via DS-n enables the delivery of energy to the energy buffer store Ce-n during this phase. During the off phase of the semiconductor switch TS-n, this buffer-stored energy can be passed on to the energy store CT-n via the matching network T, in which the thermal matching of the voltage to UT-n takes place. In this case, the energy store CT-n is charged to the voltage UT-n. The effective capacitance per stage is thus CSym-n before the switch-on. The diode D1-n is necessary in order that the initial charge applied to the buffer store Ce-n cannot immediately be discharged again via R2-n.

FIG. 5 shows a further configuration of the switching stage in which the energy stored in the balancing capacitance is transferred to the energy buffer store Ce-n by way of a capacitive coupling. In this case, the capacitance CH1-n is charged negatively to 10% of the stage voltage. The energy is subjected to charge reversal into a negative driver current supply via the coil LH-n.

It should be taken into account here that it is necessary to provide a negative initial voltage in relation to Pn from the balancing circuit. Therefore, in contrast to FIGS. 2 and 4, a resistance R3-n is also supplemented in FIG. 5. It performs this task.

In both configurations in FIGS. 4 and 5, the auxiliary capacitance CH1-n constitutes a coupling capacitance connected in series with the balancing capacitance CSym-n, the coupling capacitance being able to be discharged via the coil LH-n, and the coupling capacitance CH1-n transferring energy to the energy store CT-n of the driver assembly 11 via the coil LH-n and the diode DS-n. The processes that proceed here are the same as those already described for FIG. 4. In this case, FIG. 5 shows by way of example how the negative supply voltage can additionally be provided for the energy buffer store Ce-n and subsequently for the energy store of the driver assembly CT-n. The energy for this is realized capacitively with CH1-n and corresponding circuitry with DS-n. The diode D1-n is necessary in order that the initial charge applied to the buffer store Ce-n cannot immediately be discharged again via R3-n With reference to FIG. 6, an explanation is given below of how the trigger signal for the switches T1-n, T2-n in FIGS. 1, 2, 4, 5 can be optically transferred highly precisely. It is pointed out here that the optical generation of the trigger signal can be effected independently of the concrete embodiment of the high-power switching module 1. The optical generation of the trigger signal can thus also be effected in the case of high-power switching modules which are embodied differently than illustrated in FIGS. 1-5, but by their nature always have an energy store of the driver assembly and a semiconductor switch.

It is provided that the high-power switching module 1 is assigned an optical trigger network 20, which is optically coupled to the driver networks of the individual switching stages 10 in order to switch the switching stages 10 simultaneously. The networks are electrically isolated. The optical trigger network 20 has a plurality of light emitting elements LED1-n, which can be embodied for example as light emitting diodes, but also in some other way, for example as VCSEL. The light emitting elements here are each part of a subcircuit 21 having a current supply IA and also a capacitance C2-n besides the respective light emitting element LED1-n.

In this case, it is provided that stage-individually the current IA at the operating point flows through the light emitting element LED1-n of each stage. The current IA has the effect that the light emitting element LED1-n emits a small basic luminous flux. An additional current dl is provided by way of the discharge of the capacitance C2-n. The current through the light emitting element LED-n is increased or decreased depending on the direction of the additional current dl (dl can be both positive and negative). This has the effect that the light emitting element LED1-n changes from the state in which it emits the small basic luminous flux to a state in which it emits a higher luminous flux or emits a lower luminous flux, the higher luminous flux corresponding to the signal "high" and the lower luminous flux corresponding to the signal "low".

The discharge of the capacitance C2-n (in a positive or negative direction) of all the stages is triggered by a control device, illustrated as control device 15 in FIG. 1.

The optical trigger network 20 is coupled via an optical coupling 70 to an optical trigger array 30 having a plurality of light detecting elements LD1-n, each light emitting element LED1-n respectively being assigned to a light detecting element LD1-n. The optical coupling 70 can be effected for example via a free transfer path, by a plastic sheet or via an optical waveguide. The light detecting element is embodied as a photodiode, for example.

The light detecting elements LD1-n receive either a low luminous flux (low signal) or a high luminous flux (high signal). The driver circuit 11 is switched depending on that. For this purpose, a respective subcircuit 310 is provided, comprising a resistance RA-n that is connected in series with the light detecting element LD1-n and setting the operating point thereof. Furthermore, the subcircuit 310 comprises a comparator 35 in the form of an operational amplifier (corresponding to the comparator 35 in FIGS. 1, 2, 4, 5), for example, and also a capacitance C1-n and two resistances R1-n, R2-n. In this case, the light detecting element LD1-n is connected to one input of the comparator 35 via the capacitance C1-n and the resistance R1-n. The other input of the comparator is connected to the light detecting element LD1-n only via the resistance R2-n.

The mode of action of the circuit is as follows. Said one input of the comparator 35, by virtue of the capacitance C1-n in series with R1-n, has greater inertia than the input with R2-n alone. Both inputs have the voltage drop across LD1-n as reference voltage. If more luminous flux arrives (larger current on the emitter side—high signal), then there is a slight increase in voltage at LD1-n. The input of the comparator R2-n is immediately higher than the input at C1-n. There is a positive pulse at the output of the comparator 35. If less luminous flux is received (smaller current on the emitter side—low signal), then the voltage across LD1-n also becomes smaller. As a result, the input at C1-n becomes greater than at R2-n owing to the same reason (inertia of the element C1-n in series with R1-n) in respect of the comparator. A negative pulse is generated at the output of the comparator 35.

This type of triggering is also referred to as edge triggering.

Depending on whether the light detecting element LD1-n detects a high signal or a low signal, the output of the comparator 35 provides the positive voltage + or the negative voltage −, which is present on its supply lines 351, 352. This output voltage of the comparator 35 controls the gate terminals of the complementarily constructed transistors or switches T1-n, T2-n. In this case, the comparator 35 provides only a positive pulse or a negative pulse. The gate signals of the switches T1-n and respectively T2-n can vary in the range of 5 V to 20 V, for example, in terms of absolute value. The comparator 35 is supplied by the dual flyback converter ICSp-n (see FIGS. 2, 4, 5), the input of which is supplied by a part of the balance current. The input of the dual flyback converter ICSp-n in each stage is connected in parallel with the energy buffer store Ce-n, which is always charged at least by a partial current from the balance current.

In this case, the energy store CT-n in FIGS. 1, 2, 4, 5 is discharged via the transistor T1-n when the latter is turned on, and its voltage level defines the voltage at the control terminal G of the semiconductor switch TS-n for this case. Here T1-n and thus TS-n are switched on via positive voltage and T2-n is switched on and TS-n is thus switched off by negative voltage. The logic is alternatively also configurable reversibly, of course, that is to say that TS-n can be switched on by negative voltage and TS-n can be switched off by positive voltage (a switching element TS-n in which the sense of the polarity for "on" and "off" is reversed being used in such a case).

The same control signal from the comparator 35 that switches on the transistor T2-n and thus switches off the semiconductor switch TS-n brings the energy transfer switch Se-n to the state closed or "on". It holds true here that the energy transfer switch Se-n is a "normally closed" switch, i.e. it is always closed apart from the instant when the semiconductor switch TS-n is switched on. The energy transfer switch Se-n is opened by way of the same control pulse that drives T1-n and switches on the semiconductor switch TS-n, such that no current flows via the energy transfer switch Se-n when the energy buffer store Ce-n is being charged via the balancing capacitance CSym-n. The sole difference is that the control pulse that opens the energy transfer switch Se-n closes the switch T1-n.

Figure 6:
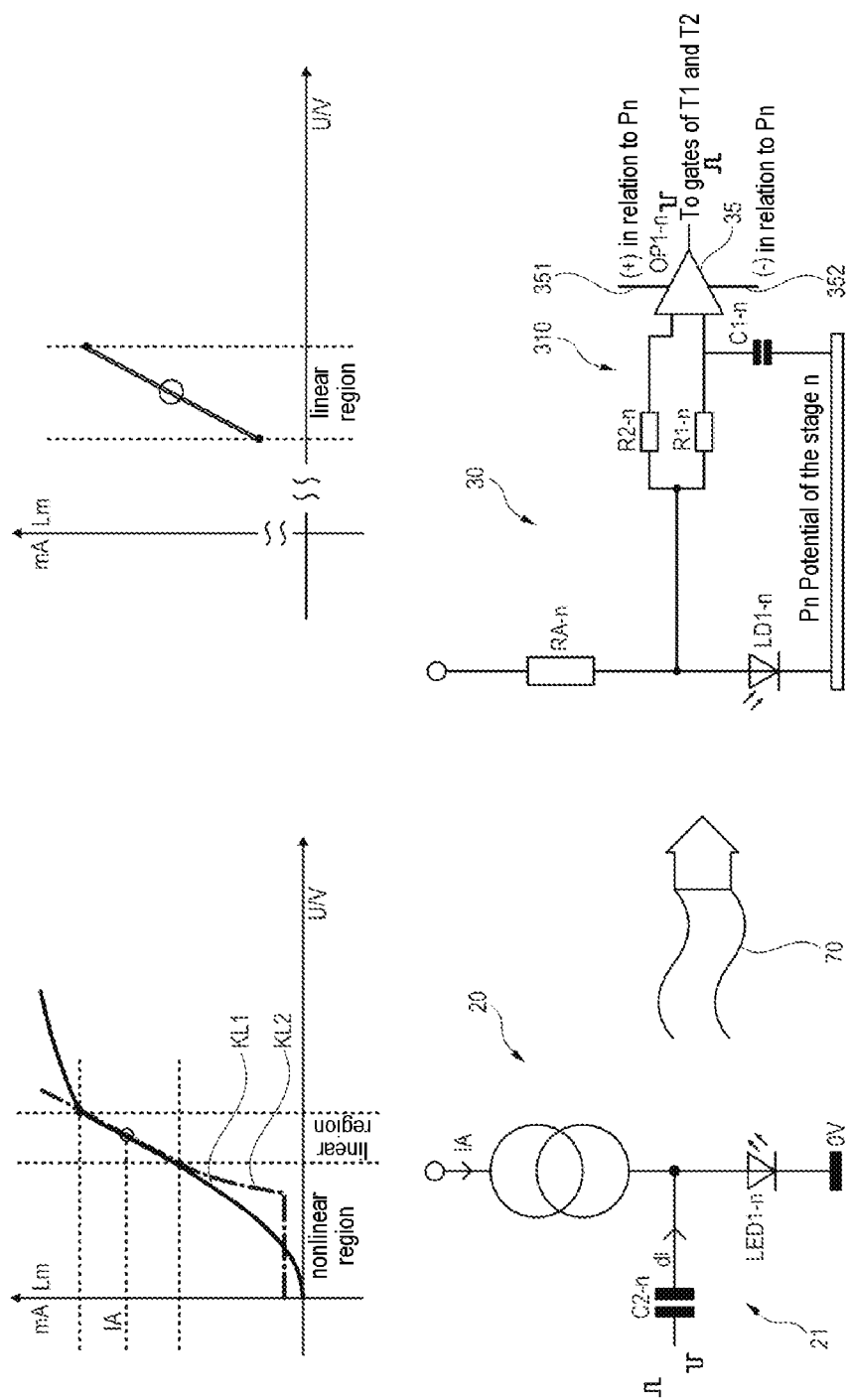
FIG. 6 schematically shows an optical trigger network of a high-power switching module for the direct pulse energy feeding of a consumer, the optical trigger network optically triggering synchronous switching of all switching stages of the high-power switching module by way of edge triggering, and also two assigned diagrams showing the current-voltage characteristic curve.
Figure 6A:
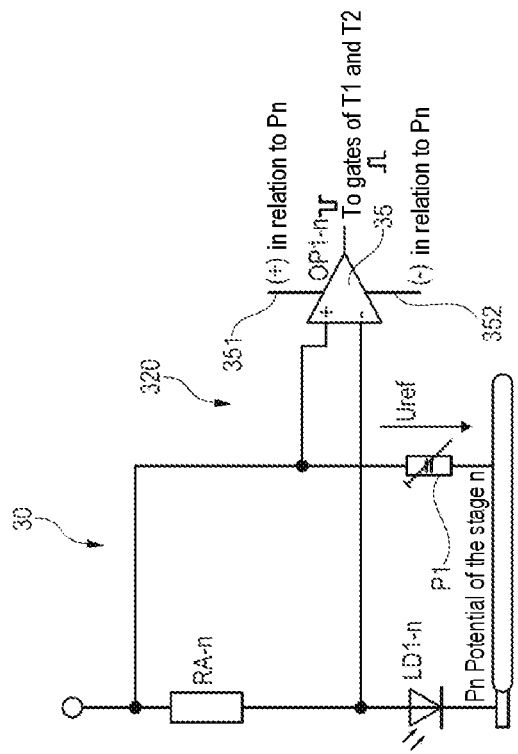
FIG. 6*a* shows an optical trigger network in accordance with FIG. 6, the switching stages of the high-power module being optically triggered by way of threshold triggering.
Figure 6A:
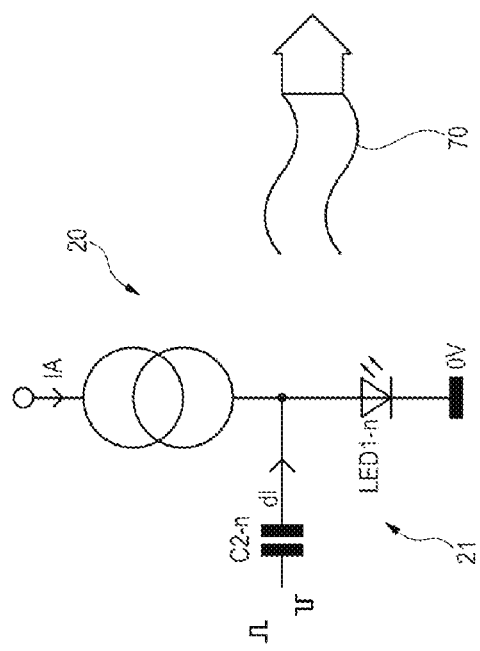

FIG. 6a shows a further exemplary embodiment of optical triggering. The exemplary embodiment in FIG. 6a has an optical trigger network 20 embodied in the same way as in FIG. 6, and so reference is made to the explanations concerning the latter. The difference with respect to the exemplary embodiment in FIG. 6 is that the optical trigger array 30 has a differently embodied subcircuit 320 for switching the comparator 35. In this regard, provision is made for a fixed reference voltage to be applied to one, first input + of the comparator 35, said reference voltage being able to be set by way of a potentiometer P1. The voltage present at the light detecting element LD1-n is applied to the other, second input − of the comparator 35, which input is accordingly variable. Depending on whether the variable voltage at the second input is greater or less than the fixed voltage at the first input, a positive voltage + or a negative voltage − is provided at the output of the comparator 35, and is present at the gate terminals of the switches T1-n, T2-n.

This type of triggering is also referred to as threshold triggering.

The following requirements are at least satisfied by the optical trigger network 20:
- by means of an optical transfer path what is achieved is that the driver assemblies 11 deliver their energy synchronously with a picosecond's difference and all the switching stages are switched on an off.
- The light emitting elements LED1-n and the light detecting elements LD1-n are coordinated with one another.
- A highly precise transfer is effected with a jitter of less than 200 ps of the leading and trailing edges of a trigger pulse.

FIG. 6 also shows the characteristic curve KL1 of the light emitting element LED1-n and the characteristic curve KL2 of the light detecting element LD1-n (these characteristic curves being applicable both to the optical triggering in accordance with FIG. 6 and to the optical triggering in accordance with FIG. 6a). Both the light emitting element and the light detecting element are operated in each case in the linear region of the characteristic curve, in which the current (mA) or the luminous flux (Lm) and the voltage (U/V) are linked approximately linearly. This is associated with the advantage that time shifts that arise as a result of charge reversal of the junction capacitance and thermal effects during the semiconductor transition from "nonconducting" to "conducting" are avoided. The linear region of the characteristic curves KL1, KL2 is illustrated in an enlarged view at the top right in FIG. 6.

Via the capacitance C2-n an additional current dl is supplied in the same way in all the subcircuits 21 as described. By virtue of the additional current dl the receiving diodes LD1-n then detect a high state if dl is positive and a low state if dl is negative.

In this case, in the respective driver circuit 11 stage-individually enough light arrives for each receiving diode LD. On the receiver side the comparator 35 converts the received luminous flux into electrical levels. The energy stores CT-n of the driver assembly deliver their energy, in a manner initiated by the high state detected by the receiving diode LD1-n, equally rapidly and virtually immediately, namely with merely a difference in the picoseconds range, to the control terminals or gate terminals of the respective semiconductor switches TS-n.

The optical triggering considerably reduces delays that would occur in the case of electrical triggering and moreover largely avoids temperature effects. The switching process can accordingly be defined very accurately.

Returning to FIGS. 1 to 5 it is also pointed out that there is substantially no phase shift between the induced current in the secondary circuit sek and the current in the primary circuit pr, and so an energy transfer between the primary circuit pr and the secondary circuit sek takes place substantially without a temporal delay. The energy buffer store is thus already charged by the energy of the balancing capacitance during the on phase of the semiconductor switch. The energy buffer store passes on the buffer-stored energy to the energy store of the driver assembly in the off state of the semiconductor switch for the subsequent switch-on processes.

FIG. 7 shows one exemplary embodiment of the configuration of the semiconductor switch TS-n and of the assigned conductive planes, two semiconductor switches of different switching stages being arranged next to one another on the same substrate 36. The semiconductor switch TS-n is embodied in each case in the form of an unpackaged semiconductor die 31, also referred to as a bare die. The semiconductor die 31 has a planar top side and a planar underside. The planar top side forms the emitter terminal, and the planar underside forms the collector terminal. The planar underside of the semiconductor die 31 is arranged on a planar first conductive plane 32, such that the collector terminal is contacted via the conductive plane 32.

A planar second conductive plane 33 is situated below the first conductive plane 32. In this case, the two conductive planes 32, 33 are separated from one another by an insulation layer 34 extending between the two conductive planes 32, 33. In this case, the distance between the two conductive planes 32, 33 or the thickness of the insulation layer 34 is less than 100 µm and is 50 µm, for example.

As illustrated, the conductive planes 32, 33 are embodied here with a small offset. The latter is advantageous in order to realize the interconnections of the stages.

The contacting of the top side or of the emitter terminal of the semiconductor die 31 is effected via two flat copper clips 37 extending from the second conductive plane 33 onto the top side of the semiconductor die 31. The collector terminal of the semiconductor die 31 is provided by the first conductive plane 32.

The conductive planes 32, 33 constitute exemplary embodiments of the lines 16 which connect the individual switching stages and are illustrated in FIG. 1. In this case, the collector of one conductive plane forms the emitter of the next higher switching stage, as is also evident from FIG. 8, which will also be discussed below.

As can be gathered from the lower illustration in FIG. 7, provision can be made for the matching network T described with reference to FIGS. 1, 2, 4 and 5 to be arranged directly under the respective switching element TS-n, such that the respective components are exposed to the same temperature.

The overall arrangement is arranged on a ceramic substrate 36.

The construction described makes it possible to reduce the construction inductance in each stage, as explained in specific detail below. The aim here is to realize a fastest possible switching process of the semiconductor switch TS-n. The solution provided in accordance with FIG. 7 is based on the concept of constructing the current path in such a way that the inductance that retards the switching process is compensated for by the direct proximity of the magnetic fields from forward current and reverse current. The magnetic field reduced in this way retards the switching process to only a reduced extent. This also increases the synchronism and achievable switching frequency (for example 10 kHz) of the individual switching stages, such that it is possible to realize a higher number of stages and switches for even higher voltages. High voltages in the range of up to 30 kV can be realized in this case.

The advantages associated with the arrangement in FIG. 7 are explained below on the basis of a numerical example.

The following empirical law is taken as a basis (from F. W. Grover: "Inductance calculations: working formulas and table", Instrument society of America 1973, ISBN 0-87664-557-0):

$$L \approx 0.004 * l * \pi * \frac{d}{B} \text{ in uH*}$$

where
l: length of the conductors in cm
d: distance between the conductors in cm
B: width of the conductors in cm The way in which the inductance of the switching stages decreases in the case of a construction in accordance with FIG. 7 will be explained with reference to one switching stage. The explanation assumes a positive current direction (from the collector to the emitter for this specific case). The semiconductor switch TS-n is assumed to be an IGBT, for example.

The current conductive planes 32, 33 for the collector and the emitter are embodied in accordance with FIG. 7 as large surfaces arranged one above the other and arranged at the smallest possible distance from one another. Owing to the required insulation strength (U≥1.7 kV), between the two surfaces it is necessary to ensure sufficient insulation by the insulation layer 34. Arranging the current conductive planes 32, 33 one above the other ensures short return flowing of the same current that flows via the collector into the stage and flows away/further via the emitter. With the abovementioned formula, given I=1.6 cm, B=2.8 cm and d=50 µm, the following holds true, for example:

$$L_{ST} \approx 0.004 \frac{\mu H}{cm} * 1.6 \text{ cm} * \pi * \frac{50 * 10^{-4} \text{ cm}}{2.8 \text{ cm}} \approx 36 \text{ pH}$$

This computational example reveals that the inductance per stage is almost completely cancelled by the construction described.

A further advantage associated with the circuit in FIG. 7 is that bond wires that are otherwise customary are replaced by flat, wide copper clips 37. In this case, such clips 37 can be used independently of the specific, implemented construction of the semiconductor switch TS-n. The copper clips 37 are embodied as flat, wide metal sheets, i.e. the width and length of the copper clips 37 are greater than the thickness thereof. In addition to the emitter terminal, the control terminal (gate terminal) can also be realized by way of copper clips (not illustrated).

The use of wide copper clips instead of bond wires results in a reduced parasitic inductance and in particular in improved dissipation of heat from the component. In order to illustrate this, the traditional variant of gate-emitter contacting with bond wires is compared below on the basis of calculations with connection technology using wide copper clips with regard to parasitic inductance and thermal resistance.

The calculations are carried out using the formulae below for each load-emitter circuit (analogous calculations being possible for the gate circuit). Only the emitter contacting from the semiconductor die 31 to the associated conductive plane 33 on the ceramic substrate 36 is considered here. The copper clip 37 can be assumed to be a flat conductor for simplification. The empirical formula for the inductance LF of a flat conductor can be specified as follows.

$$L_F = 0.002 * l * \left( \ln\left(\frac{2*l}{B+C}\right) + 0.5 \right) \text{ in uH}$$

The following holds true by way of example for the copper clips 37 considered:

l=0.8 cm: length of the conductor in cm
B=0.5 cm: width of the conductor in cm
C=0.3 cm: thickness/height of the conductor in cm The contacting consists of two such flat conductors 37. Overall, that results in the halving of the calculated inductance LF. Consequently, the emitter terminal inductance $L_{SEB}$ with two copper clips is as follows:

$$L_{SEB} = \frac{L_F}{2} \approx 954 \text{ pH}$$

That is compared with the parasitic inductance of a bond wire. The parasitic inductance of a bond wire $L_{BD}$ can be approximated in a simplified manner as the inductance of a conductor with a circular cross-section.

$$L_{BD} = 0.002 * l * \left( \ln\left(\frac{2*l}{r}\right) - 0.75 \right) \text{ in } \mu H$$

The following typically holds true, for example:
l=1 cm: length of the conductor in cm
r=0.02 cm: radius of the conductor The contacting typically consists of eight such bond wires. Therefore, the calculated inductance $L_{BD}$ is divided by eight in order to work out the emitter terminal inductance with eight bond wires $L_{SBD}$.

$$L_{SBD} = \frac{L_{BD}}{8} \approx 964 \text{ pH}$$

A slightly reduced parasitic inductance is thus found with the use of two wide copper clips instead of the use of eight bond wires.

However, the contacting results in a significantly increased heat dissipation into the ceramic substrate 36. In order to demonstrate this, the thermal resistance of both construction variants is compared with one another below. The following holds true for the power loss dissipated from the semiconductor die 31 to the conductive plane 33 on the substrate 36:

$$R_{th} = \frac{l}{\lambda * A}$$

In this case:

λ: is the thermal conductivity. The following holds true for aluminum: $\lambda_{Al}$=236 W/mK. The following holds true for copper: $\lambda_{Cu}$=380 W/mK l: is the length of the material through which the power loss flows. The following holds true for the clip: $l_B$=0.008 m. The following holds true for the bond wire: $l_D$=0.01 m A: the cross section through which the power loss flows. The following holds true for two clips: $A_B$=2*C*B=2*0.005 m*0.003 m=3*10$^{-5}$ m$^2$ where C=height of the clip and B =width of the clip. The following holds true for eight bond wires: $A_D$=8*π*r$^2$=8*π*(0.0002 m)$^2$≅1.005*10$^{-6}$ m$^2$ where r=radius of a bond wire.

The following thus holds true for the power loss in the case of a clip connection and in the case of a bond connection:

$$R_{thB} = \frac{0.008 \text{ m}*\text{m}*\text{K}}{380 \text{ W}*3*10^{-5} \text{ m}*\text{m}} \approx$$

$$0.7 \frac{K}{W} \text{(Thermal resistance of the clip connection)}$$

$$R_{thBD} =$$

$$\frac{0.01*\text{m}*\text{m}*\text{K}}{236 \text{ W}*1.005*10^{-6} \text{ m}*\text{m}} \approx 42 \frac{K}{W} \left( \begin{array}{c} \text{Thermal resistance of the} \\ \text{connection in the case of bonding} \end{array} \right)$$

From the calculation it follows that: the power loss is dissipated worse by the bond wires. By contrast, by means of a clip connection the losses are dissipated better from the die by a factor of 60. Owing to the more robust construction with clips, solderable heat sinks on the emitter side are also possible. Furthermore, improved dissipation of heat from the die is already afforded if only because of the enlarged surface area of the clip toward the top, even without a heat sink.

In summary, it may be stated that copper clips enable a reduction of the parasitic inductance. In comparison with bond wires, a smaller number of copper clips is required in this case. This affords advantages in particular in applications with a high and steep current pulse. Furthermore, the use of copper clips results in improved power loss dissipation via the top side and thus improved cooling of the semiconductor die 31, which can dissipate heat at both sides on account of the cooling by way of copper clips at its top side. In this case, provision can be made for heat sinks to be arranged on the substrate 36. Furthermore, copper clips provide a robust variant from a mechanical standpoint.

Figure 8:
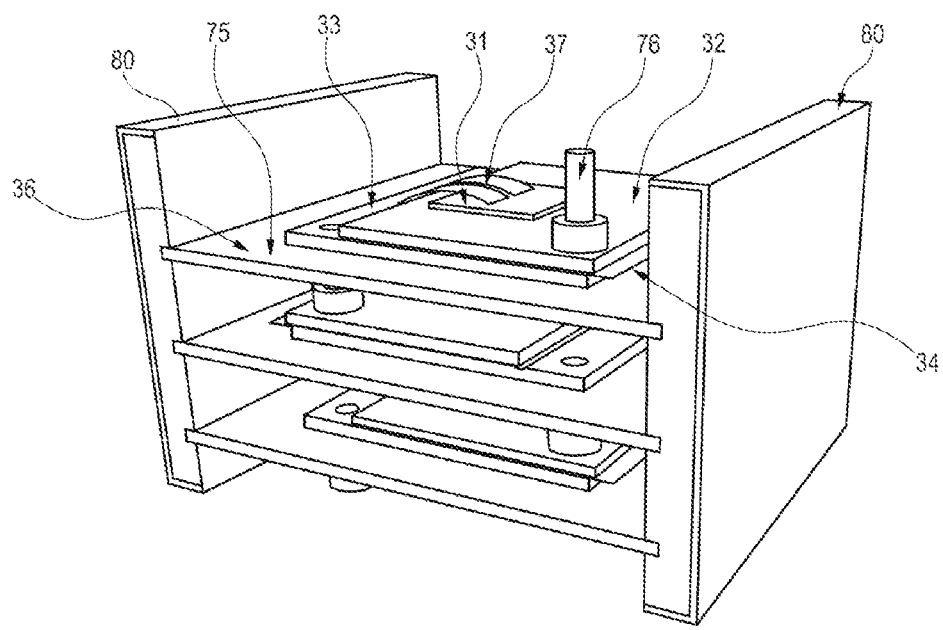
FIG. 8 shows a stack construction with a plurality of switching stages embodied according to FIG. 7.
Figure 8:
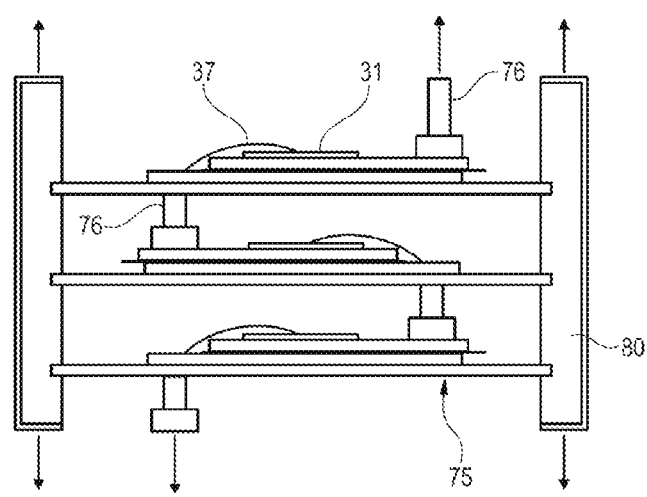

FIG. 8 shows a stack construction of a high-power switching module, each switching stage with a construction in accordance with FIG. 7 being arranged in a dedicated plane 75 within the stack construction (although only one semiconductor switch is embodied on a ceramic substrate 36).

In this case, the individual planes 75 are arranged between two circuit carrier holders 80 with an EMC coating. Each plane 75 comprises a substrate 36 with two conductive planes 32, 33, between which a glass insulation 34 is arranged, as described with reference to FIG. 7. Furthermore, the respective semiconductor die 31 is illustrated, which is contacted via two flat copper clips 37 extending from the second conductive plane 33 onto the top side of the semiconductor die 31. Offset solderable connection elements 76 serve for the electrical connection of the individual planes 75.

The stack construction in accordance with FIG. 8 is easy to repair since the individual switching stages can be separately repaired and exchanged. Furthermore, the current is conducted back and forth in a serpentine fashion via the connection elements 76, with the result that the magnetic fields change accordingly and in part mutually cancel one another out in the process.

It goes without saying that the invention is not restricted to the embodiments described above and various modifications and improvements can be made, without departing from the concepts described here. Furthermore, it is pointed out that any of the features described can be used separately or in combination with any other features, provided that they are not mutually exclusive. The disclosure extends to all combinations and subcombinations of one or more features which are described here, and encompasses these. If ranges are defined, they encompass all values within these ranges and also all subranges which are included in a range.

The invention claimed is:

1. A high-power switching module for the direct pulse energy feeding of a consumer with a plurality of switching stages connected in series, each switching stage comprising:
a semiconductor switch with collector terminal, emitter terminal and control terminal, which depending on the voltage present at the control terminal comprises a switched-on state, in which a current flows between the collector terminal and the emitter terminal, and a switched-off state, in which no current flows between the collector terminal and the emitter terminal,
a driver assembly acting on the semiconductor switch, the driver assembly comprising two switches for controlling the control terminal of the semiconductor switch and also an energy store, which provides energy for switching on the semiconductor switch,
a balancing capacitance connected in parallel with the semiconductor switch between collector terminal and emitter terminal,
a coupling element and an energy buffer store,
the coupling element coupling a primary circuit comprising the balancing capacitance and the semiconductor switch to a secondary circuit comprising the energy buffer store,
the coupling element being provided and embodied for obtaining energy of the balancing capacitance and delivering this energy to the energy buffer store during the on phase of the semiconductor switch, and the energy buffer store being provided and embodied for delivering the obtained energy to the energy store of the driver assembly when the semiconductor switch is in the switched-off state.

2. The high-power switching module as claimed in claim 1, wherein the coupling element comprises a transformer having a primary winding in the primary circuit and a secondary winding in the secondary circuit.

3. The high-power switching module as claimed in claim 2, wherein the transformer is embodied as a printed circuit board transformer in such a way that the primary circuit of the transformer is formed by a singular loop of a conductive plane and the secondary circuit of the transformer is formed by a secondary winding on a coil former inserted into the loop.

4. The high-power switching module as claimed in claim 1, wherein the coupling element is embodied by capacitive elements.

5. The high-power switching module as claimed in claim 4, wherein the coupling element comprising a coupling capacitance connected in series with the balancing capacitance, and also a coil connected in parallel with the coupling capacitance, the coupling capacitance transferring energy to the energy store of the driver assembly via a diode.

6. The high-power switching module as claimed in claim 1, wherein the energy buffer store is formed by one or more capacitive elements.

7. The high-power switching module as claimed in claim 1, wherein an energy transfer switch is provided in the secondary circuit, said energy transfer switch being closed when the semiconductor switch is turned off and opening in the on phase of the semiconductor switch.

8. The high-power switching module as claimed in claim 1, wherein the driver assembly furthermore comprises a thermal matching network, which influences the control voltage of the semiconductor switch in a temperature-dependent manner.

9. The high-power switching module as claimed in claim 8, wherein the matching network is embodied for adapting the control voltage of the gate-emitter capacitance of the semiconductor switch in terms of amplitude in such a way that the switch-on point in time of the semiconductor switch is largely independent of the temperature.

10. The high-power switching module as claimed in claim 8, wherein the matching network and the semiconductor switch are arranged in spatial proximity in such a way that they are exposed virtually to the same temperature, the components of the driver assembly including the matching network and also the semiconductor switch being realized on a thick-film ceramic.

11. The high-power switching module as claimed in claim 1, wherein the two switches of the driver assembly for switching the semiconductor switch operate complementarily in the sense that one switch is open when the other switch is closed, and vice versa, and the two switching states define the switched-on state and the switched-off state of the semiconductor switch, the two switches being switched by the output voltage of a comparator.

12. The high-power switching module as claimed in claim 1, wherein an optical trigger network is provided, which is optically coupled to the driver assemblies of the individual switching stages in order to simultaneously switch the switching stages, the optical trigger network having a plurality of light emitting elements switchable simultaneously between a low emitted luminous flux and a high emitted luminous flux, and each light emitting element of the optical trigger network (20) being assigned at least one light detecting element of a switching stage, the at least one light detecting element initiating a change in the switching state of the switching stage depending on whether said element receives a low luminous flux or a high luminous flux.

13. The high-power switching module as claimed in claim 12, wherein the light emitting elements are set stage-individually to a current at the operating point at which the light emitting element emits a luminous flux, a positive or negative additional current being impressed on the current at the operating point for switching over to a high luminous flux or a low luminous flux.

14. The high-power switching module as claimed in claim 13, wherein the additional current is impressed for all light emitting elements in an identical manner by the discharge of a capacitor.

15. The high-power switching module as claimed in claim 12, wherein the two switches of the driver assembly for switching the semiconductor switch operate complementarily in the sense that one switch is open when the other switch is closed, and vice versa, and the two switching states define the switched-on state and the switched-off state of the semiconductor switch, the two switches being switched by the output voltage of a comparator, and wherein the optical network controls the state of the two switches for each switching stage, in which case for each switching stage the variable voltage of the associated light detecting element is fed to one input of the comparator and a reference voltage is applied to the other input of the comparator.

16. The high-power switching module as claimed in claim 12, wherein the two switches of the driver assembly for switching the semiconductor switch operate complementarily in the sense that one switch is open when the other switch is closed, and vice versa, and the two switching states define the switched-on state and the switched-off state of the semiconductor switch, the two switches being switched by the output voltage of a comparator, and wherein the optical network controls the state of the two switches for each switching stage, in which case for each switching stage the variable voltage of the associated light detecting element is fed to one input of the comparator via a resistance and to the other input of the comparator via an RC element.

17. The high-power switching module as claimed in claim 1, wherein the semiconductor switch is embodied in the form of a semiconductor die with a planar top side and a planar underside, which embodies the emitter terminal at its planar top side and the collector terminal at its planar underside, or vice versa, the planar underside of the semiconductor die being arranged on a planar first conductive plane and being contacted via the planar first conductive plane, a planar second conductive plane extending below the planar first conductive plane, an insulation layer extending between the planar first conductive plane and the planar second conductive plane, and from the second planar conductive plane a contact connection extending to the planar top side of the semiconductor die for the contacting of the planar top side.

18. The high-power switching module as claimed in claim 17, wherein the distance between the first conductive plane and the second conductive plane is less than 100 µm, in particular less than 60 µm.

19. The high-power switching module as claimed in claim 1, wherein at least the emitter terminal of the semiconductor switch is contacted by at least one flat copper clip.

20. The high-power switching module as claimed in claim 17, wherein at least the emitter terminal of the semiconductor switch is contacted by at least one flat copper clip and wherein the contact connection of at least the emitter terminal of the semiconductor switch is provided by at least one copper clip extending from the second planar conductive plane to the planar top side of the semiconductor die.

\* \* \* \* \*